United States Patent
Liu

(10) Patent No.: US 11,837,643 B2
(45) Date of Patent: Dec. 5, 2023

(54) METHOD FOR MANUFACTURING MEMORY DEVICE

(71) Applicant: TAIWAN SEMICONDUCTOR MANUFACTURING COMPANY LTD., Hsinchu (TW)

(72) Inventor: Chien Hung Liu, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 233 days.

(21) Appl. No.: 17/200,865

(22) Filed: Mar. 14, 2021

(65) Prior Publication Data

US 2021/0202705 A1 Jul. 1, 2021

Related U.S. Application Data

(62) Division of application No. 15/895,378, filed on Feb. 13, 2018, now Pat. No. 10,950,703.

(Continued)

(51) Int. Cl.
*H01L 29/423* (2006.01)
*H01L 27/11521* (2017.01)
(Continued)

(52) U.S. Cl.
CPC .... *H01L 29/42324* (2013.01); *H01L 29/0649* (2013.01); *H01L 29/40114* (2019.08);
(Continued)

(58) Field of Classification Search
CPC . H01L 27/1203; H01L 21/7624–76291; H01L 21/84
See application file for complete search history.

(56) References Cited

U.S. PATENT DOCUMENTS 7,755,113 B2   7/2010 Yamazaki et al.
8,395,217 B1 * 3/2013 Cheng ............... H01L 21/76289
                                                    438/222

(Continued)

FOREIGN PATENT DOCUMENTS

KR   1020130103265 A   9/2013
KR     101441941 B1    9/2014

OTHER PUBLICATIONS

Notice of Allowance and cited references dated Mar. 29, 2021 issued by the Korean Intellectual Property Office for the Korean counterpart application No. 10-2018-0136098.

(Continued)

*Primary Examiner* — John A Bodnar
(74) *Attorney, Agent, or Firm* — WPAT LAW; Anthony King

(57) ABSTRACT

A semiconductor device includes a substrate, a gate structure disposed over the substrate, a drain structure disposed in the substrate, and a source structure disposed in the substrate on an n opposite side of the gate structure from the drain structure. The substrate includes a first semiconductor layer, a second semiconductor layer over the first semiconductor layer, and an insulating layer sandwiched between the first semiconductor layer and the second semiconductor layer. The source structure and the drain structure include a same conductivity type. The source structure includes at least an epitaxial layer. The source structure extends deeper into the substrate than the drain structure.

20 Claims, 21 Drawing Sheets

Related U.S. Application Data

(60) Provisional application No. 62/582,586, filed on Nov. 7, 2017.

(51) Int. Cl.
    *H01L 29/66*     (2006.01)
    *H01L 29/788*     (2006.01)
    *H01L 29/06*     (2006.01)
    *H01L 21/28*     (2006.01)
    *H01L 29/417*     (2006.01)
    *H01L 29/78*     (2006.01)
    *H10B 41/30*     (2023.01)

(52) U.S. Cl.
    CPC .. *H01L 29/41783* (2013.01); *H01L 29/42328* (2013.01); *H01L 29/66825* (2013.01); *H01L 29/7835* (2013.01); *H01L 29/7881* (2013.01); *H10B 41/30* (2023.02)

(56) References Cited

U.S. PATENT DOCUMENTS

| | | |
|---|---|---|
| 8,866,188 B1 | 10/2014 | Tsai et al. |
| 2007/0281446 A1 | 12/2007 | Winstead et al. |

OTHER PUBLICATIONS

U.S. Pat. No. 7,755,113B2 corresponds to KR101441941B1.
U.S. Pat. No. 8,866,188B1 corresponds to KR1020130103265A.

\* cited by examiner

_US 11,837,643 B2_

METHOD FOR MANUFACTURING MEMORY DEVICE

PRIORITY DATA

This patent is divisional application of U.S. patent application Ser. No. 15/895,378 filed Feb. 13, 2018, entitled of "SEMICONDUCTOR STRUCTURE FOR MEMORY DEVICE AND METHOD FOR FORMING THE SAME", which claims the benefit of U.S. Provisional Patent Application Ser. No. 62/582,586 filed Nov. 7, 2017, the entire disclosure of which is hereby incorporated by reference.

BACKGROUND

Non-volatile memory (NVM) is often used in various devices, such as computers. NVM is a type of memory storage that can retain data even while it is not powered on. NVM may be electrically addressed or mechanically addressed. Examples of electrically addressed NVM include flash memory, EPROMs, and EEPROMs. Functionality of NVM includes having information programmed into it, having information read from it, and/or having information erased from it.

On the other hand, continuing reduction of the minimum features produced by semiconductor processes and reduction in the size of the resulting devices has enabled continued improvements in speed, performance, density, and cost per unit function of integrated circuits and systems. As reliable memory becomes increasingly important for portable devices, such as mobile phones, tablet computers and other battery operated devices, the use of NVM is increasingly prevalent. Thus the need for efficiently manufactured, robust and cost effective NVM with high performance is increasing.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
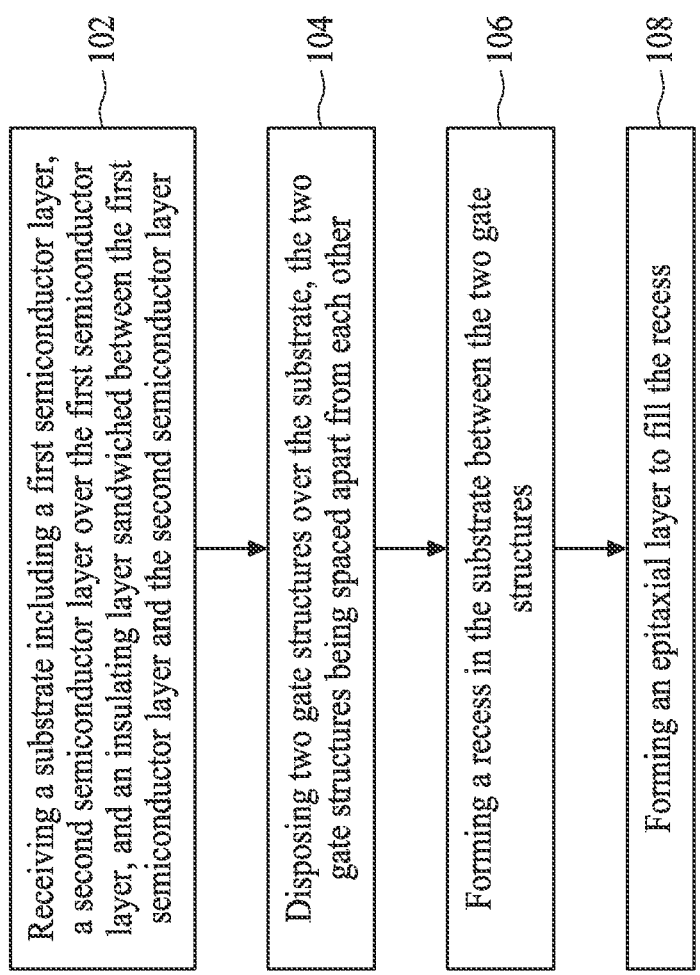
FIG. 1 is a flow chart representing a method for manufacturing a semiconductor structure for a memory device according to aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

This description of illustrative embodiments is intended to be read in connection with the accompanying drawings, which are to be considered part of the entire written description. In the description of embodiments disclosed herein, any reference to direction or orientation is merely intended for convenience of description and is not intended in any way to limit the scope of the present disclosure. Relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description only and do not require that the apparatus be constructed or operated in a particular orientation. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise. Moreover, the features and benefits of the disclosure are illustrated by reference to the embodiments. Accordingly, the disclosure expressly should not be limited to such embodiments illustrating some possible non-limiting combination of features that may exist alone or in other combinations of features; the scope of the disclosure being defined by the claims appended hereto.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

An embedded flash memory device includes an array of flash memory cell devices and logic devices supporting operation of the flash memory cell devices. Common types of flash memory cell devices include stacked-gate flash memory cell devices and split-gate flash memory cell devices. Compared to stacked-gate memory cell devices, split-gate memory cell devices have lower power consumption, higher injection efficiency, less susceptibility to short channel effects, and over erase immunity. As such, split-gate memory cell devices are more prevalent.

In some embodiments, a pair of split-gate flash memory cell devices can be arranged over a memory region, the pair of split-gate flash memory cell devices includes gate structures arranged on opposite sides of an erase gate, and word lines adjacent to the gate structures opposite to the erase gate. A source line may be formed between the pair of gate structures, and the source line is under and electrically isolated from the erase gate. It is found that the embedded split-gate flash memory cells faces trade-off between source resistance $R_S$ and cell shrinkage: To achieve Rs reduction, the source line must be heavily doped, and thus junction depth and width are both increased. More importantly, cell shrinkage capability is reduced because the increased junction depth and width render adverse impact to the channel regions. On the other hand, to improve cell shrinkage capability, junction depth and width are limited and thus Rs is increased.

Present disclosure therefore provides a semiconductor structure for a memory device and a method for manufacturing the semiconductor structure for the memory device that achieve both of Rs reduction and cell shrinkage capability by providing a source structure including an epitaxial layer or a source structure including an epitaxial layer and an underneath doped region.

FIG. 1 is a flow chart representing a method for manufacturing a semiconductor structure for a memory device 10 according to aspects of the present disclosure. The method for manufacturing the semiconductor structure for the memory device 10 includes an operation 102, receiving a substrate including a first semiconductor layer, a second semiconductor over the first semiconductor layer, and an insulating layer sandwiched between the first semiconductor layer and the second semiconductor layer. The method for manufacturing the semiconductor structure for the memory device 10 further includes an operation 104, disposing two gate structures over the substrate. More importantly, the two gate structures are spaced apart from each other. The method for manufacturing the semiconductor structure for the memory device 10 further includes an operation 106, forming a recess in the substrate between the two gate structures. The method for manufacturing the semiconductor structure for the memory device 10 further includes an operation 108, forming an epitaxial layer to fill the recess. The method for manufacturing the semiconductor structure for the memory device 10 will be further described according to one or more embodiments. It should be noted that the operations of the method for manufacturing the semiconductor structure for the memory device 10 may be rearranged or otherwise modified within the scope of the various aspects. It is further noted that additional processes may be provided before, during, and after the method 10, and that some other processes may only be briefly described herein. Thus other implementations are possible within the scope of the various aspects described herein.

Figure 2A:
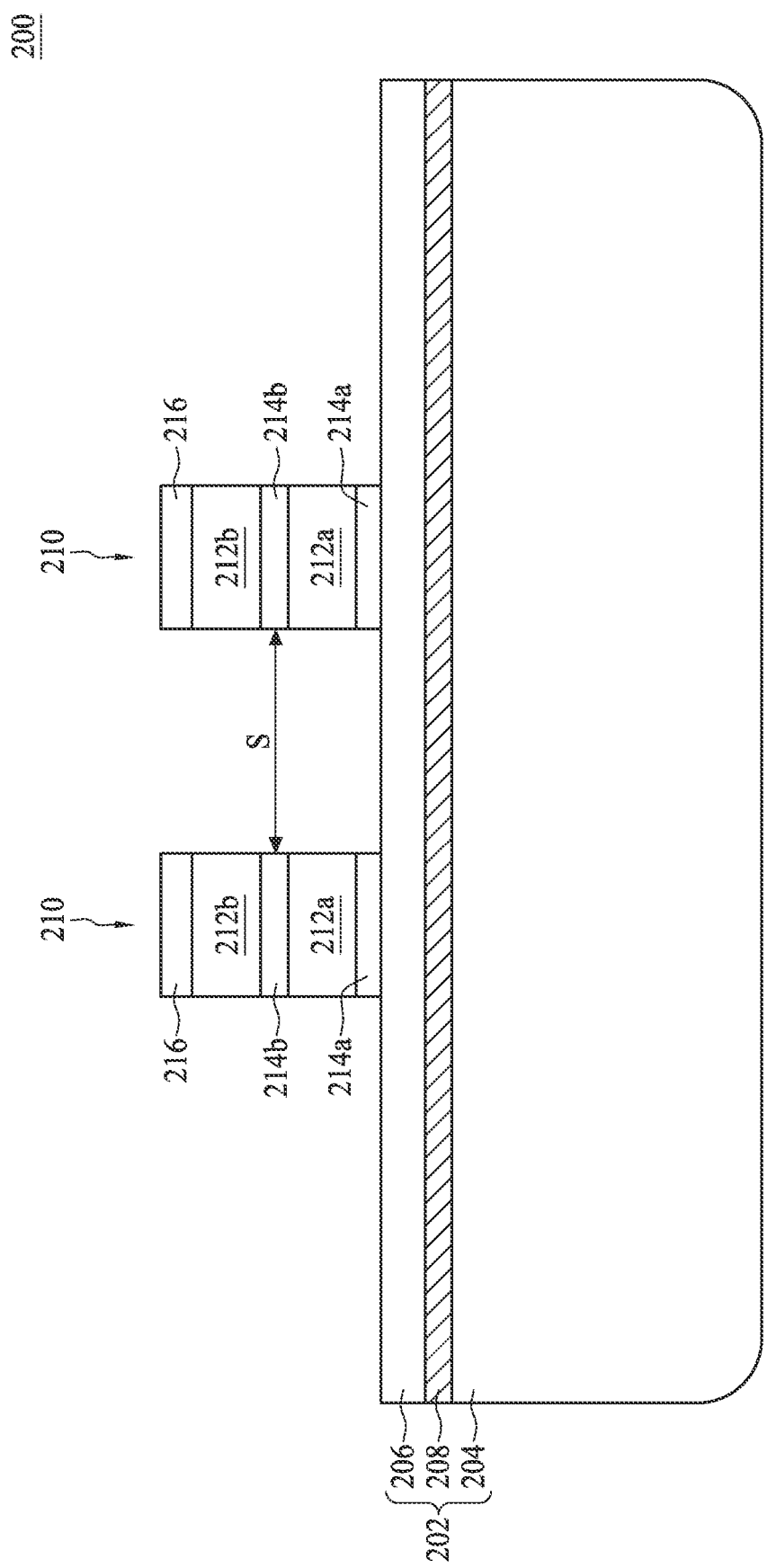
FIGS. 2A through 2D illustrate a series of cross-sectional views of a semiconductor structure for a memory device at various fabrication stages constructed according to aspects of the present disclosure in one or more embodiments.

Referring to FIG. 2A, a substrate 202 is received or provided according to operation 102. In some embodiments of the present disclosure, the substrate 202 can be a bulk semiconductor substrate. In some embodiments, the substrate 202 can be a silicon-on-insulator (SOI) substrate. For example, the substrate 202 can include a first semiconductor layer 204, a second semiconductor layer 206, and an insulating layer 208 sandwiched between the first semiconductor layer 204 and the second semiconductor layer 206.

At least two gate structures 210 are disposed over the substrate 202 according to operation 104. In some embodiments, each of the gate structures 210 includes a first gate electrode 212a spaced apart and electrically isolated from the substrate 202 by a first dielectric layer 214a, a second gate electrode 212b spaced apart and electrically isolated from the first gate electrode 212a by a second dielectric layer 214b. In some embodiments, the first gate electrode 212a is a floating gate (FG) electrode and the second gate electrode 212b is a control gate (CG) electrode. The first dielectric layer 214a interposed between the FG electrode 212a and the substrate 202 serves as floating gate dielectric, and the second dielectric layer 214b interposed between the FG electrode 212a and the CG electrode 212b serves as an inter-poly (IPO) isolation. The FG electrode 212a and the CG electrode 212b can include polysilicon, doped polysilicon, and combination thereof, but the disclosure is not limited thereto. The first dielectric layer 214a can include an oxide, such as a silicon oxide (SiO), but other materials are amenable. The second dielectric layer 214b can include a composite film such as, an oxide-nitride-oxide (ONO) film, but the disclosure is not limited thereto. A hard mask layer 216 is patterned to define locations and sizes of the gate structures 210. In some embodiments, the hard mask layer 216 is typically formed of silicon nitride (SiN), but other materials are amenable. The two gate structures 210 corresponding to two memory cell devices are spaced apart from each other by a spacing distance S, as shown in FIG. 2A. In some embodiments, the spacing distance S is substantially equal to a width of a source line to be formed. For example, the spacing distance S is between about 50 nanometers (nm) and about 300 nm, but the disclosure is not limited thereto.

Figure 2B:
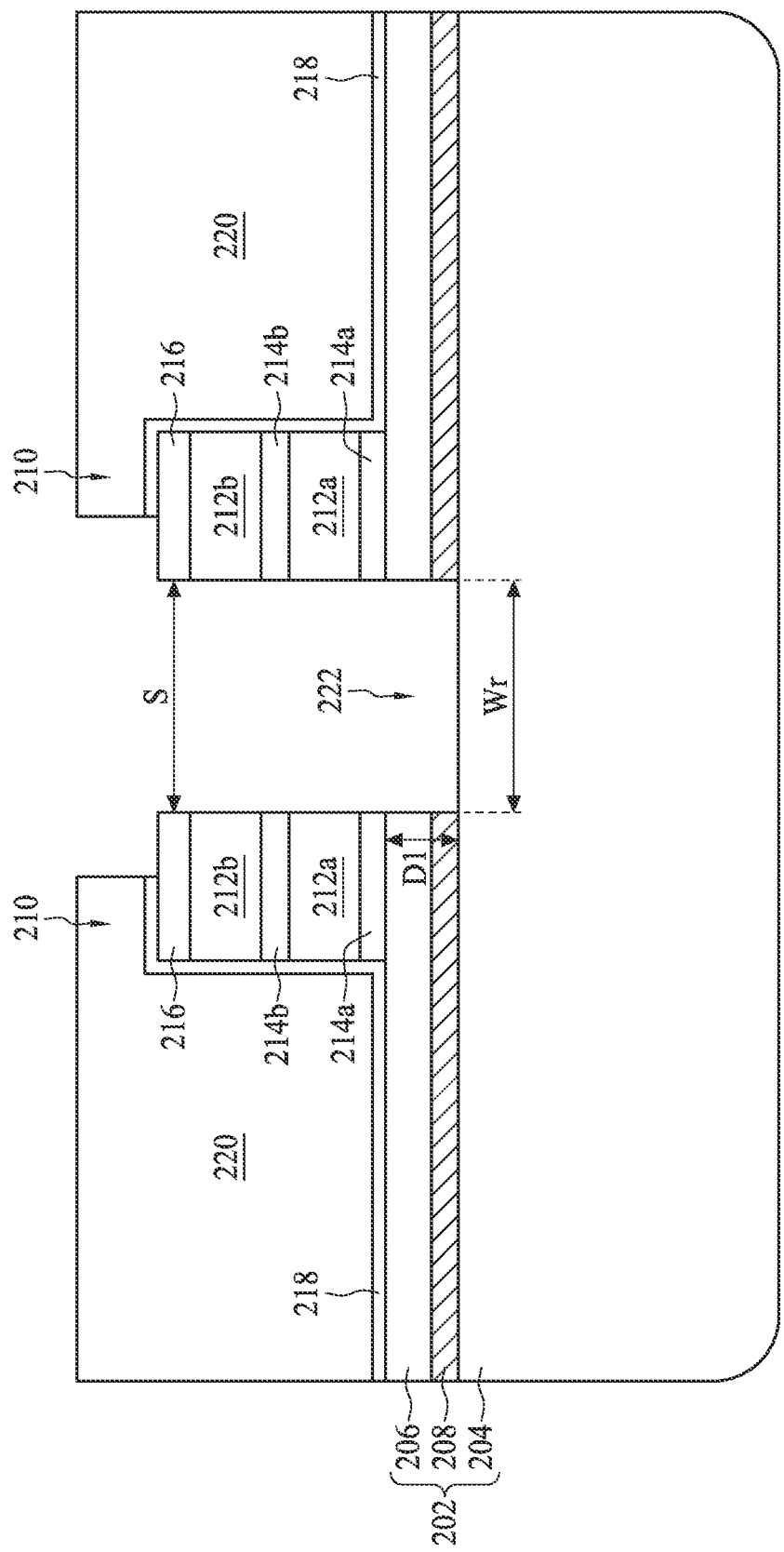

Referring to FIG. 2B, a dielectric layer 218 is formed to cover a top surface of the substrate 202, sidewalls of each gate structure 210, and a top surface of each gate structure 210. In some embodiments, the dielectric layer 218 can be a single layer including, for example but not limited to, SiO, SiN, or silicon oxynitride (SiON), but the disclosure is not limited thereto. In some embodiments, the dielectric layer 218 can include ONO film, but the disclosure is not limited thereto. A patterned photoresist 220 is disposed over the substrate 202 and the dielectric layer 218 and the substrate 202 are etched through the patterned photoresist 220. More importantly, the etching stops when the first semiconductor layer 204 is exposed. Consequently, a recess 222 is formed in between the two gate structures 210 according to operation 106, and a top surface of the first semiconductor layer 204 is exposed from a bottom of the recess 222, as shown in FIG. 2B. In some embodiments, a depth D1 of the recess 222 is substantially equal to a sum of a thickness of the second semiconductor layer 206 and a thickness of the insulating layer 208, but the disclosure is not limited thereto. Additionally, portions of the second semiconductor layer 206 are exposed by sidewalls of the recess 222. In some embodiments, a width Wr of the recess 222 is equal to or less than the spacing distance S between the two gate structures 210, but the disclosure is not limited thereto.

Figure 2C:
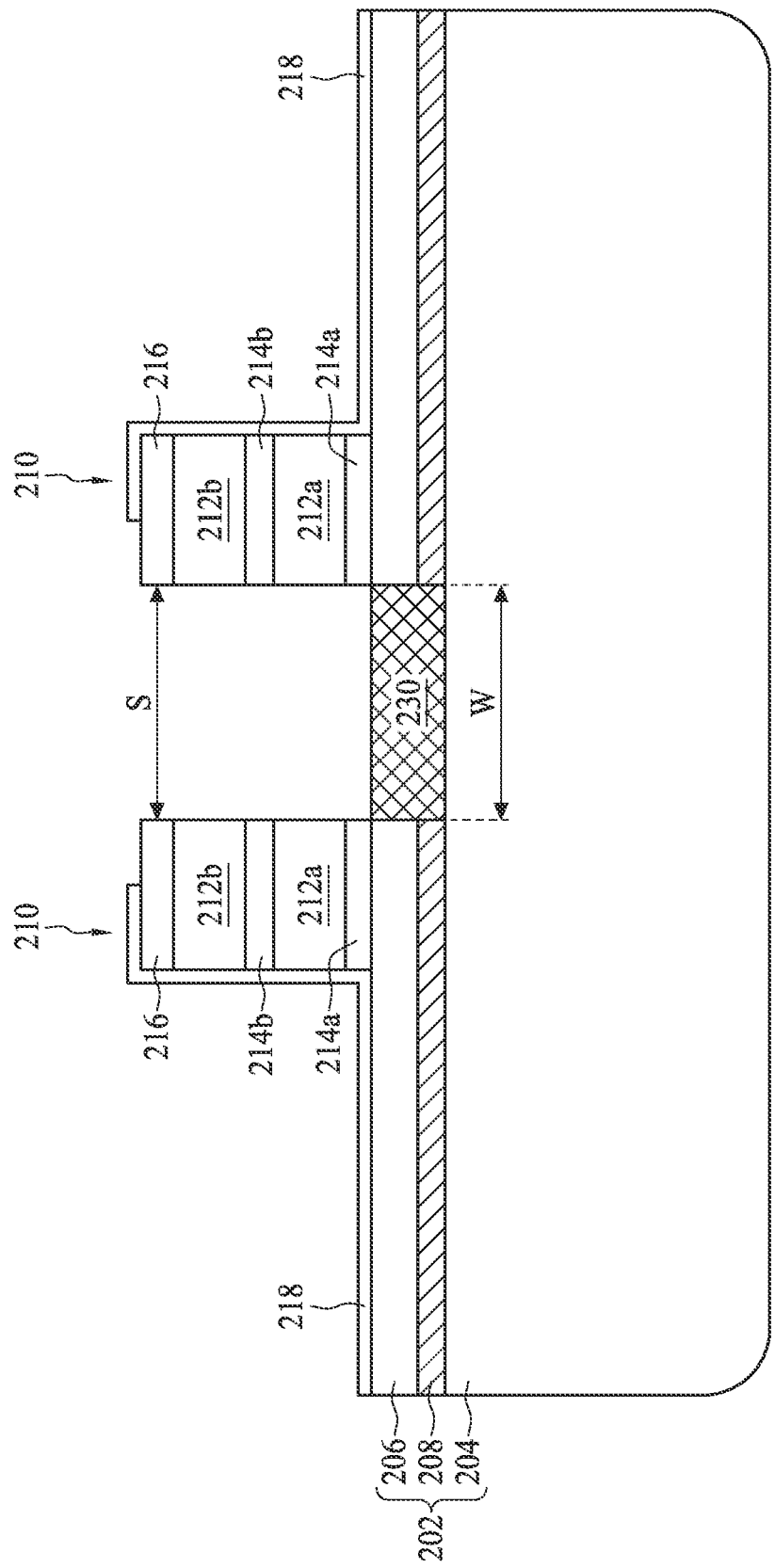
Figure 2D:
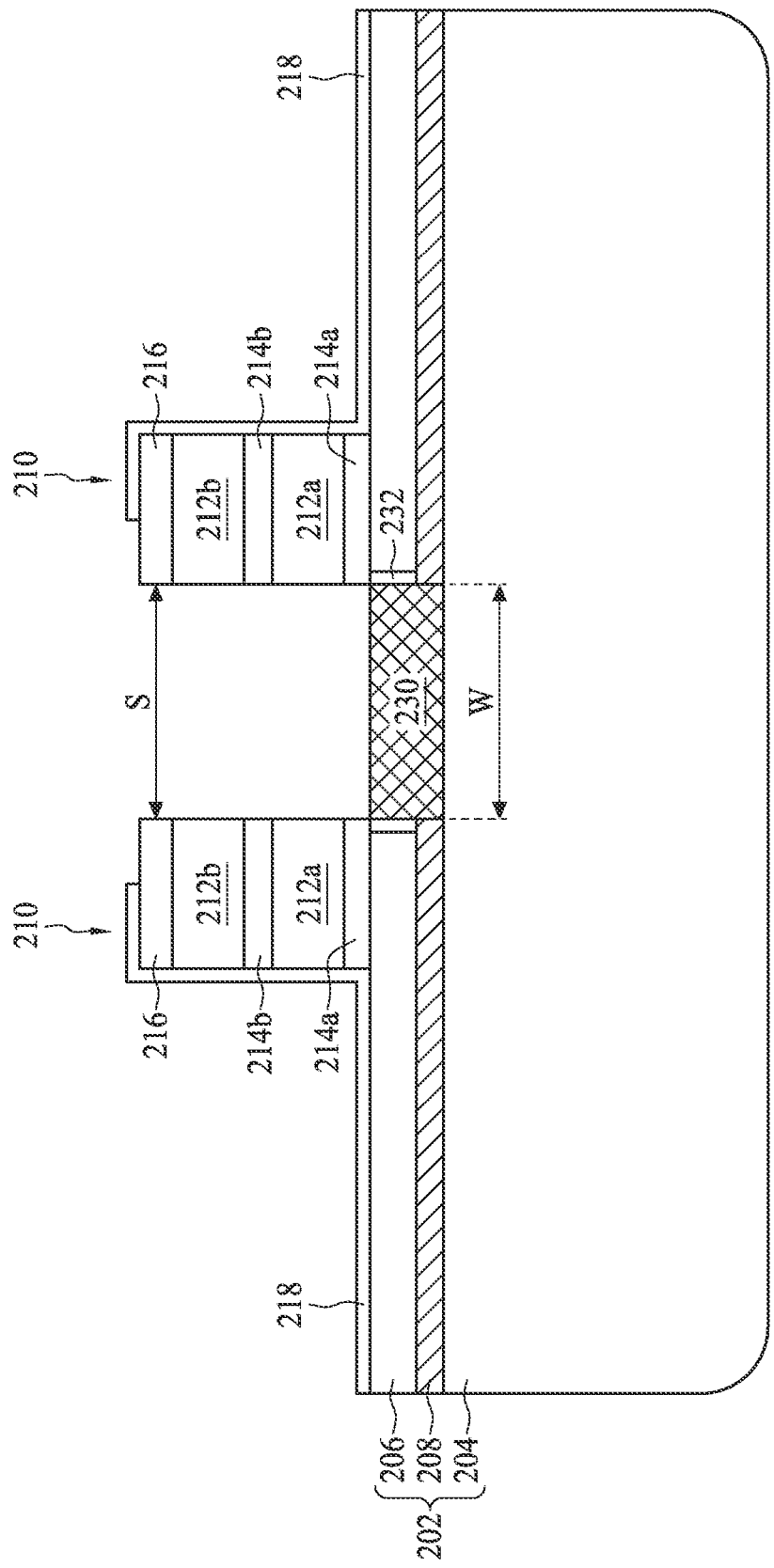

Referring to FIG. 2C, an epitaxial layer 230 is subsequently formed to fill the recess 222, according to operation 108. The epitaxial layer 230 can be formed by selective epitaxial growth (SEG), but the disclosure is not limited to thereto. In some embodiments, the epitaxial layer 230 can include silicon (Si), germanium (Ge), SiGe or other semiconductor material. More importantly, the epitaxial layer 230 is heavily doped by n-type dopants. Examples of n-type dopants that may be included in n-type doped regions include phosphorous (P), nitrogen (N), arsenic (As), antimony (Sb), and bismuth (Bi), but the disclosure is not limited to thereto. A concentration of the n-type dopants can be between about 1E18 ions/cm$^3$ and about 1E22 ions/cm$^3$, but the disclosure is not limited to thereto. Because the epitaxial layer 230 grows along the semiconductor surface exposed from the recess 222, the epitaxial layer 230 is confined between the two gate structures 210. Accordingly, a heavily-doped epitaxial layer 230 that is able to reduce Rs is obtained while the cell shrinkage capability is improved because there are no junction depth and width issues for the epitaxial layer 230. Referring to FIG. 2D, in some embodiments, a lightly-doped region 232 can be formed before forming the epitaxial layer 230. The lightly-doped region 232 is also doped by n-type dopants, and is formed by angle implantation, but the disclosure is not limited to thereto.

It should be noted other operations for forming a memory device can be performed, and will be further details in the following description.

Figure 3A:
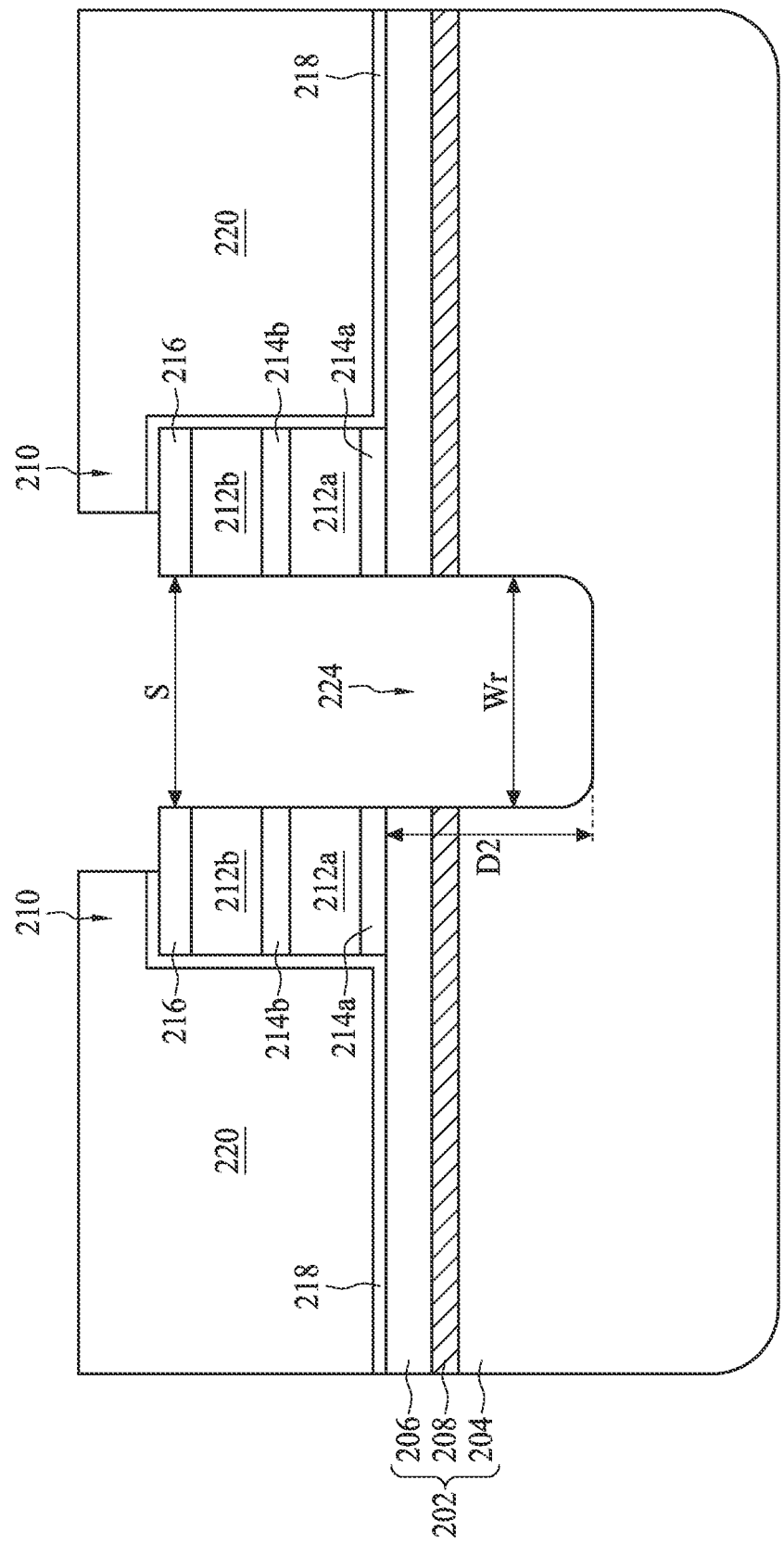
FIGS. 3A through 3C illustrate a series of cross-sectional views of a semiconductor structure for a memory device at various fabrication stages constructed according to aspects of the present disclosure in one or more embodiments.
Figure 3B:
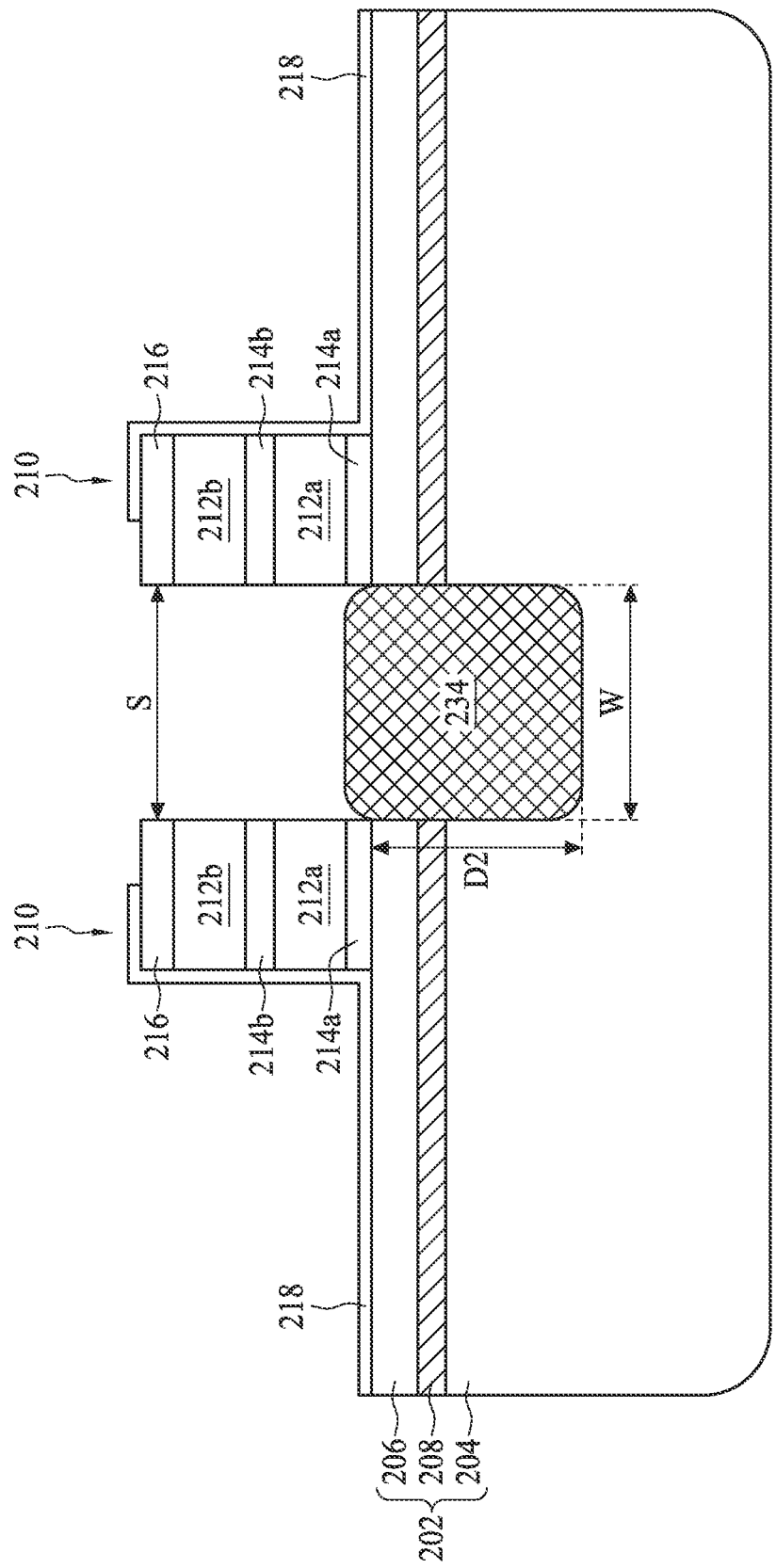
Figure 3C:
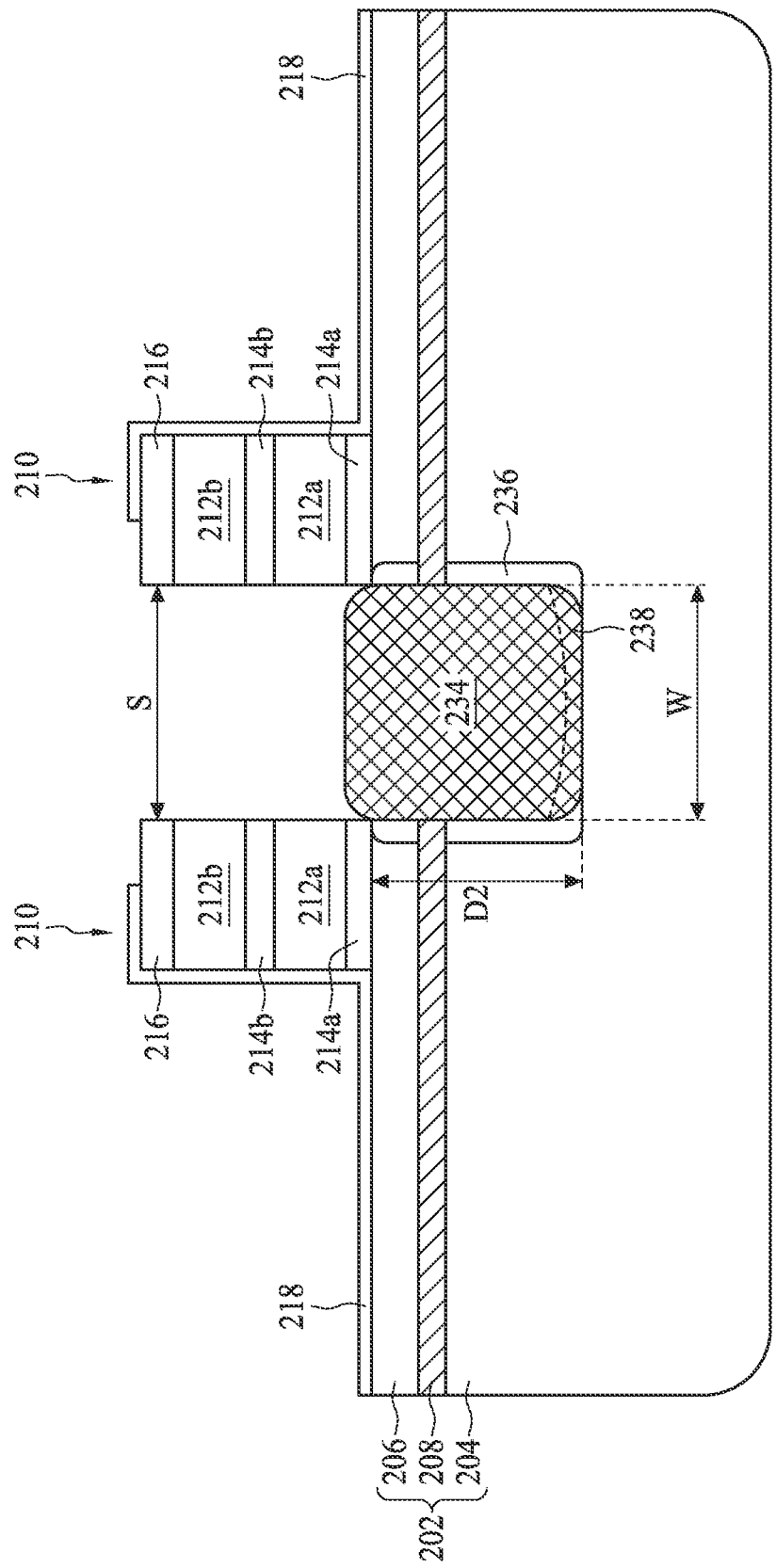

FIGS. 3A through 3C illustrate a series of cross-sectional views of a semiconductor structure for a memory device at various fabrication stages constructed according to aspects of the present disclosure in one or more embodiments. It should be noted same elements in the FIGS. 2A through 2D and 3A through 3C are designated by same numerals, and those elements can include same materials and formed by same operations. Accordingly, details for forming those elements are omitted in the interest of brevity.

Referring to FIG. 3A, a recess 224 is formed in between the two gate structures 210 according to operation 106. In some embodiments, a depth D2 of the recess 224 can be tuned as long as the profile of the two gate structures 210 are not impacted. For example, the depth D2 can be greater than a sum of a thickness of the second semiconductor layer 206 and a thickness of the insulating layer 208. As shown in FIG. 3A, a bottom surface of the recess 224 is therefore lower than a bottom surface of the insulating layer 208. Further, portions of the first semiconductor layer 204 and portions of the second semiconductor layer 206 are exposed by sidewalls of the recess 222 while portions of the first semiconductor layer 204 is exposed from the bottom of the recess 224. In some embodiments, a width Wr of the recess 224 is equal to the spacing distance S between the two gate structures 210, but the disclosure is not limited thereto.

Referring to FIG. 3B, an epitaxial layer 234 is subsequently formed to fill the recess 224, according to operation 108. The epitaxial layer 234 can be formed by SEG, but the disclosure is not limited to thereto. More importantly, the epitaxial layer 234 is heavily doped by n-type dopants. Examples of n-type dopants that may be included in n-type doped regions include P, N, As, Sb, and Bi, but the disclosure is not limited to thereto. A concentration of the n-type dopants can be between about 1E18 ions/cm$^3$ and about 1E22 ions/cm$^3$, but the disclosure is not limited to thereto. Because the epitaxial layer 234 grows along the semiconductor surface exposed from the recess 224, the epitaxial layer 234 is confined between the two gate structures 210. Accordingly, a heavily-doped epitaxial layer 234 that is able to reduce Rs is obtained while the cell shrinkage capability is improved because junction depth and width are not issues. Referring to FIG. 3C, in some embodiments, a lightly-doped region 236 can be formed before forming the epitaxial layer 234. The lightly-doped region 236 is also doped by n-type dopants, and is formed by angle implantation, but the disclosure is not limited to thereto. Further, in some embodiments, an undoped epitaxial layer 238 can be formed before forming the doped epitaxial layer 234 if the epitaxial layer 234 includes Ge. In some embodiments, a Ge concentration in the undoped epitaxial layer 238 is lower than Ge concentration in the doped epitaxial layer 234 for reducing dislocation effect.

It should be noted other operations for forming a memory device can be performed, and will be further details in the following description.

Figure 4:
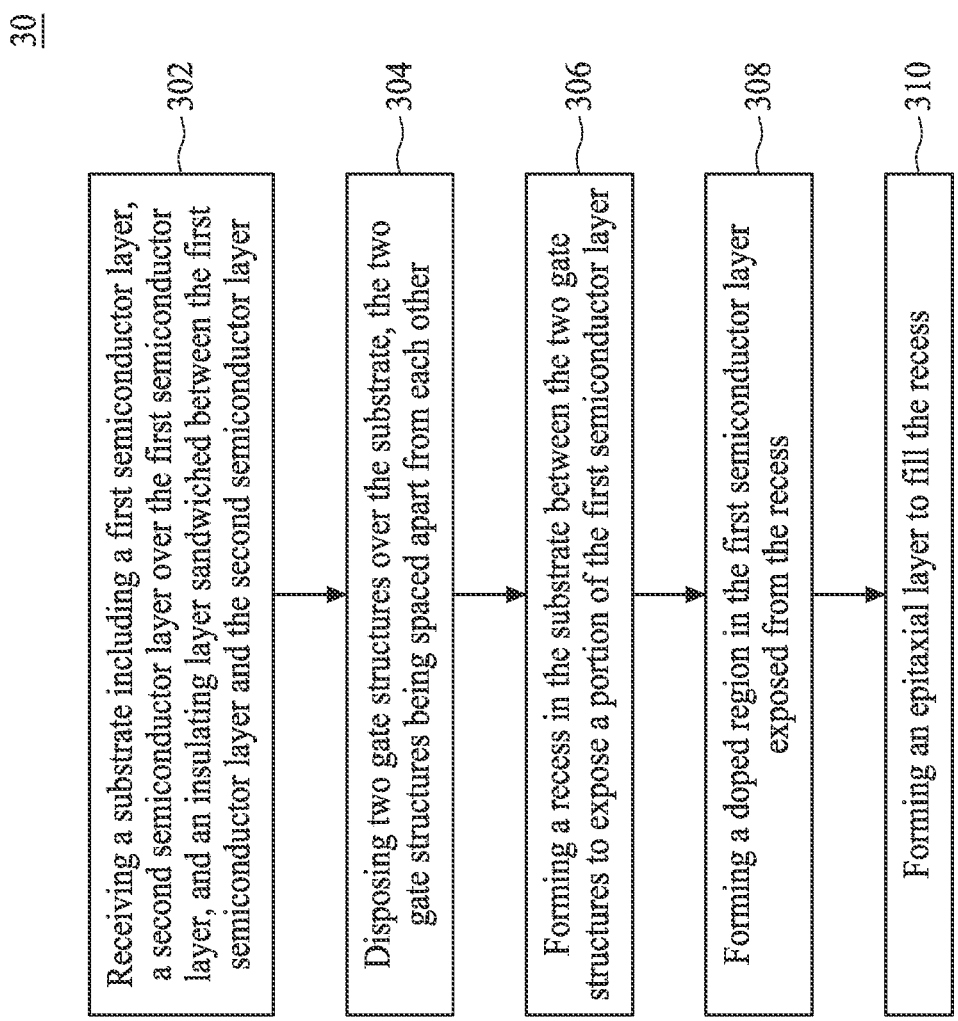
FIG. 4 is a flow chart representing a method for manufacturing a semiconductor structure for a memory device according to aspects of the present disclosure.

FIG. 4 is a flow chart representing a method for manufacturing a semiconductor structure for a memory device 30 according to aspects of the present disclosure. The method for manufacturing the semiconductor structure for the memory device 30 includes an operation 302, receiving a substrate including a first semiconductor layer, a second semiconductor over the first semiconductor layer, and an insulating layer sandwiched between the first semiconductor layer and the second semiconductor layer. The method for manufacturing the semiconductor structure for the memory device 30 further includes an operation 304, disposing two gate structures over the substrate. More importantly, the two gate structures are spaced apart from each other. The method for manufacturing the semiconductor structure for the memory device 30 further includes an operation 306, forming a recess in the substrate between the two gate structures to expose a portion of the first semiconductor layer. The method for manufacturing the semiconductor structure for the memory device 30 further includes an operation 308, forming a doped region in the first semiconductor layer exposed from the recess. The method for manufacturing the semiconductor structure for the memory device 30 further includes an operation 310, forming an epitaxial layer to fill the recess. The method for manufacturing the semiconductor structure for the memory device 30 will be further described according to one or more embodiments. It should be noted that the operations of the method for manufacturing the semiconductor structure for the memory device 30 may be rearranged or otherwise modified within the scope of the various aspects. It is further noted that additional processes may be provided before, during, and after the method 30, and that some other processes may only be briefly described herein. Thus other implementations are possible within the scope of the various aspects described herein.

FIGS. 5A through 5E illustrate a series of cross-sectional views of a semiconductor structure for a memory device at various fabrication stages constructed according to aspects of the present disclosure in one or more embodiments. It should be noted same elements in the FIGS. 5A through 5E and 2A through 3D can include same materials and formed by same operations. Accordingly, details for forming those elements are omitted in the interest of brevity.

Figure 5A:
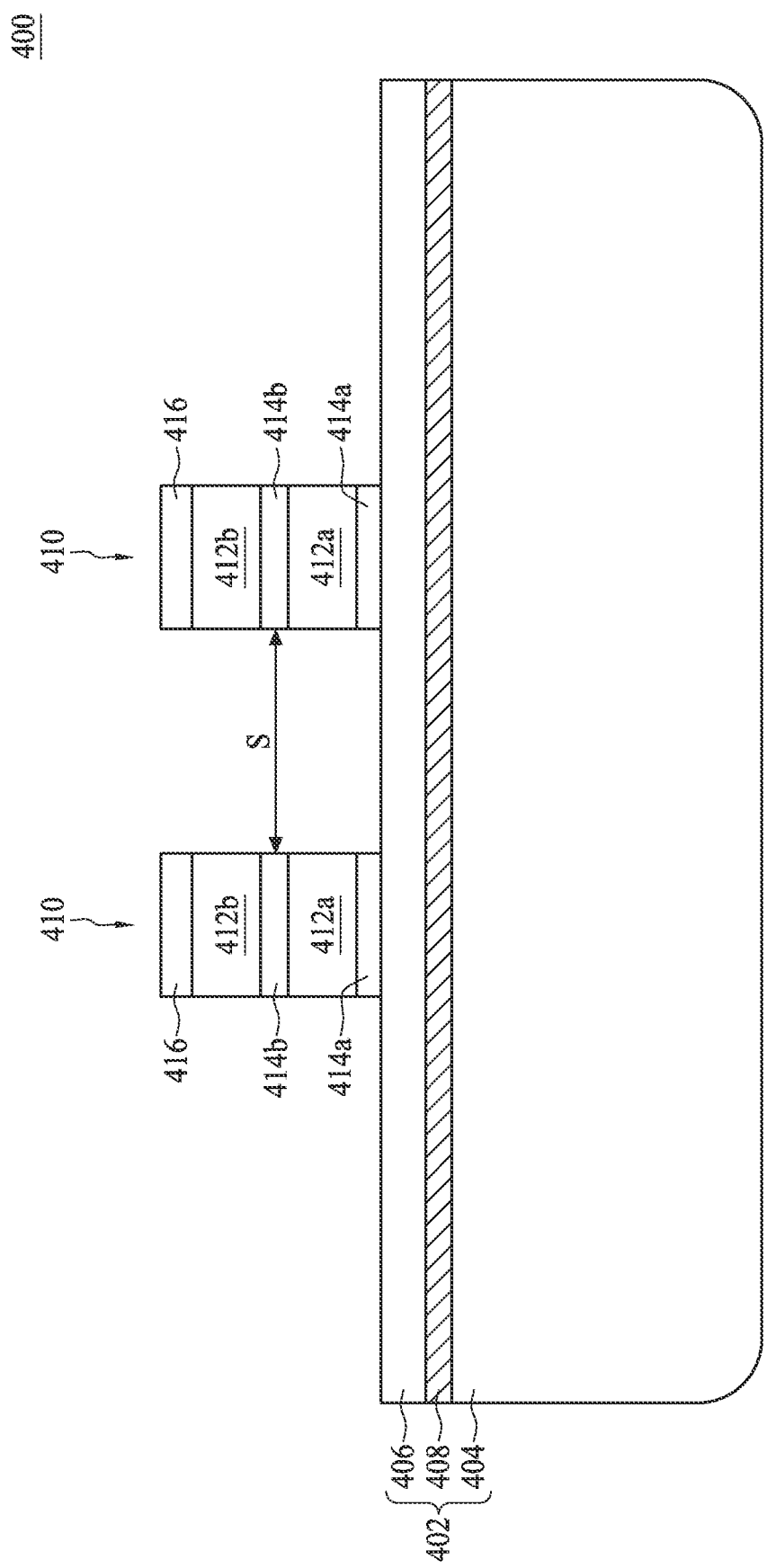
FIGS. 5A through 5J illustrate a series of cross-sectional views of a semiconductor structure for a memory device at various fabrication stages constructed according to aspects of the present disclosure in one or more embodiments.

Referring to FIG. 5A, a substrate 402 is received or provided according to operation 302. In some embodiments of the present disclosure, the substrate 402 can be a bulk semiconductor substrate. In some embodiments, the substrate 402 includes a silicon-on-insulator (SOI) substrate. For example, the substrate 402 can include a first semiconductor layer 404, a second semiconductor layer 406, and an insulating layer 408 sandwiched between the first semiconductor layer 404 and the second semiconductor layer 406.

At least two gate structures 410 are disposed over the substrate 402 according to operation 304. In some embodiments, each of the gate structures 410 includes a first gate electrode 412a spaced apart and electrically isolated from the substrate 402 by a first dielectric layer 414a, a second gate electrode 412b spaced apart and electrically isolated from the first gate electrode 412a by a second dielectric layer 414b. In some embodiments, the first gate electrode 412a is a floating gate (FG) electrode and the second gate 412b is a control gate (CG) electrode. The first dielectric layer 414a interposed between the FG electrode 412a and the substrate 402 serves as floating gate dielectric, and the second dielectric layer 414b interposed between the FG electrode 412a and the CG electrode 412b serves as an inter-poly (IPO) isolation. A hard mask layer 416 is patterned to define locations and sizes of the gate structures 410. The two gate structures 410 corresponding to two memory cell devices are spaced apart from each other by a spacing distance S, as shown in FIG. 5A. In some embodiments, the spacing distance S is substantially equal to a width of a source line to be formed.

Figure 5B:
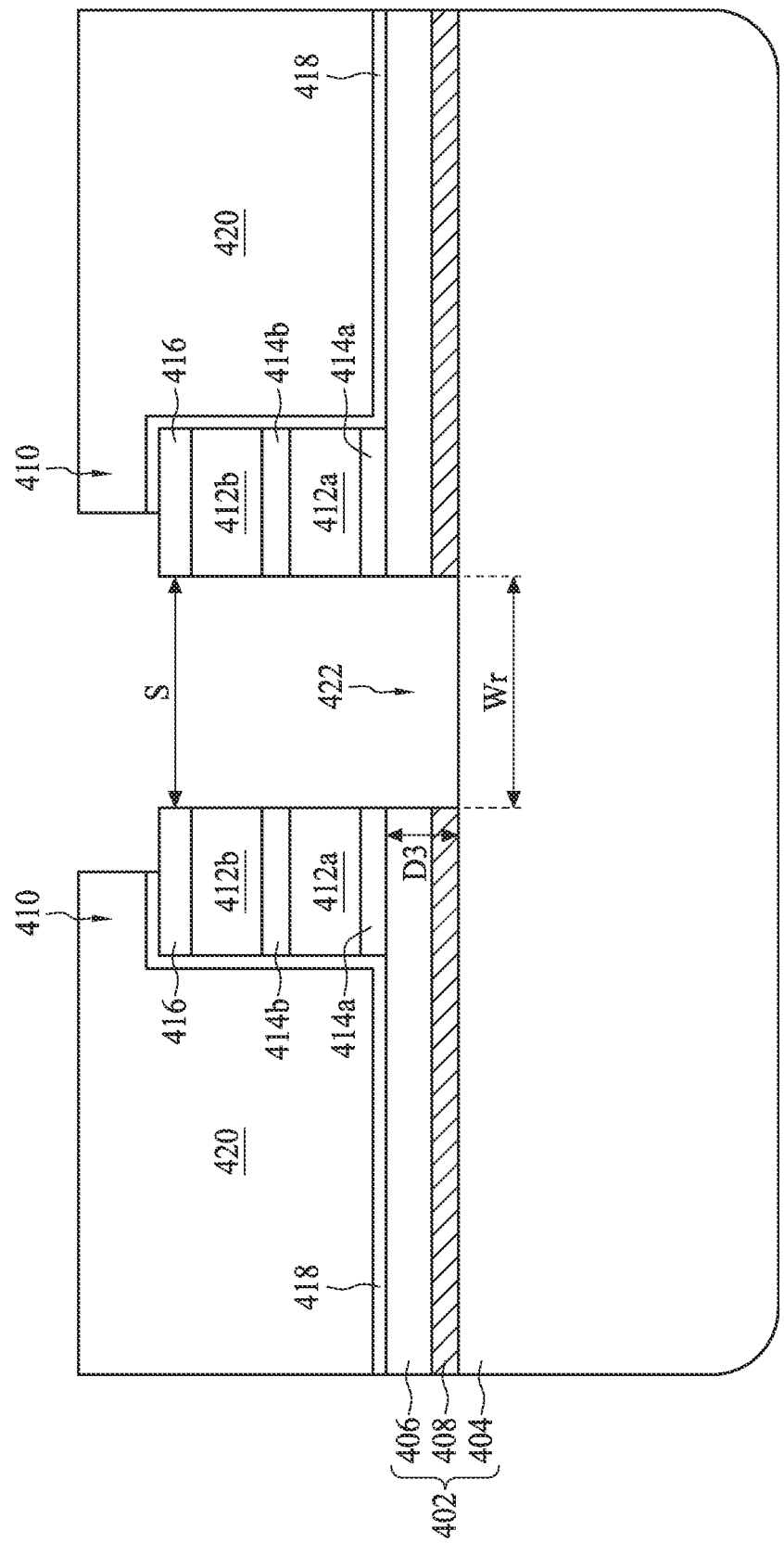

Referring to FIG. 5B, a dielectric layer 418 is formed to cover a top surface of the substrate 402, sidewalls of each gate structure 410, and a top surface of each gate structure 410. A patterned photoresist 420 is disposed over the substrate 402 and the dielectric layer 418 and the substrate 402 are etched through the patterned photoresist 420. More importantly, the etching stops when the first semiconductor layer 404 is exposed. Consequently, a recess 422 is formed in between the two gate structures 410 according to operation 306, and a top surface of the first semiconductor layer 404 is exposed from a bottom of the recess 422, as shown in FIG. 5B. In some embodiments, a depth D3 of the recess 422 is substantially equal to a sum of a thickness of the second semiconductor layer 406 and a thickness of the insulating layer 408, but the disclosure is not limited thereto. Additionally, portions of the second semiconductor layer 406 are exposed by sidewalls of the recess 422. In some embodiments, a width Wr of the recess 422 is substantially equal to or less than the spacing distance S between the two gate structures 410, but the disclosure is not limited thereto.

Figure 5C:
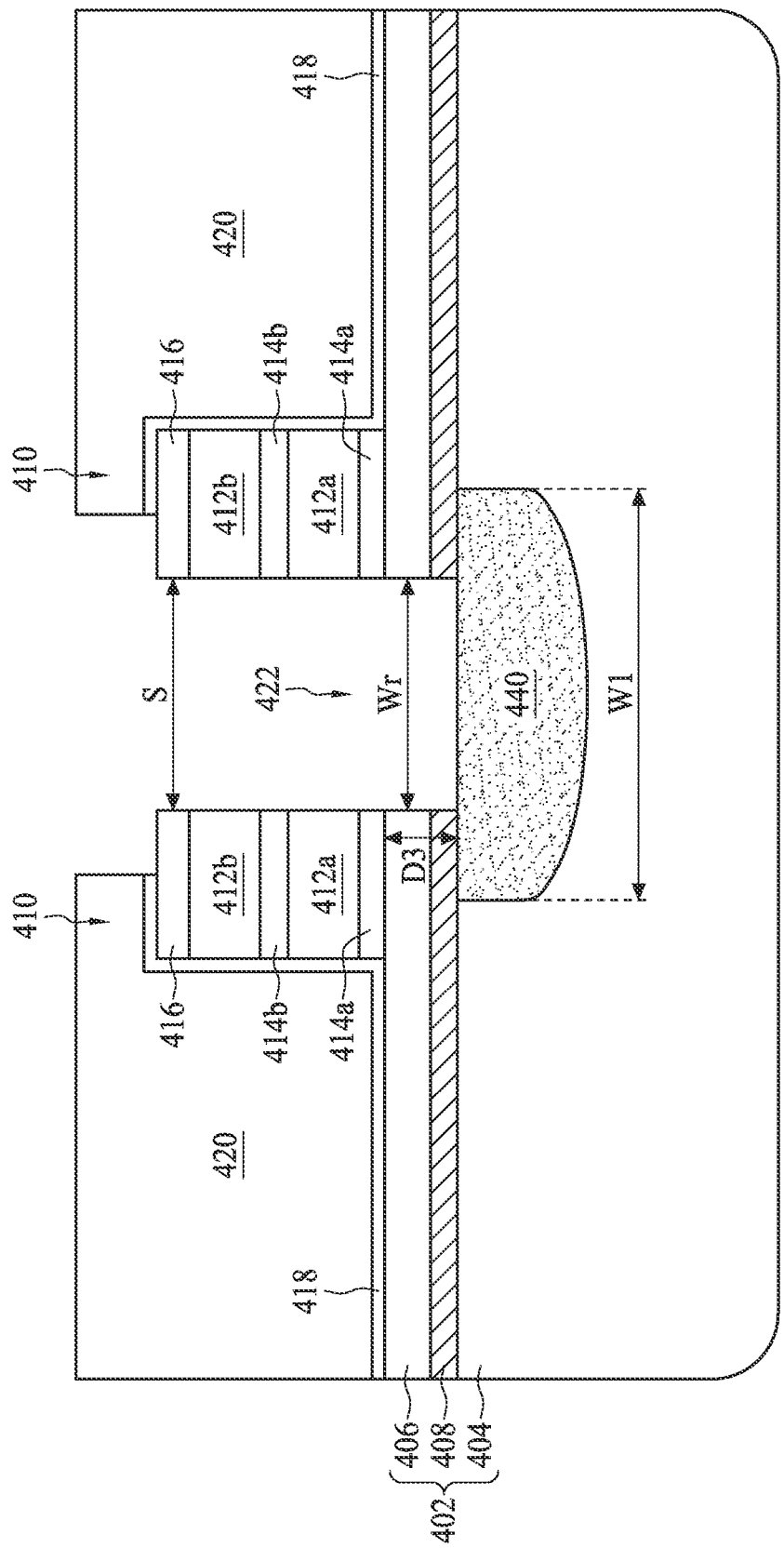

Referring to FIG. 5C, a doped region 440 is formed in the first semiconductor layer 404 exposed from the recess 422 according to operation 308. In some embodiments, the dope region 440 can be formed by ion implantation, but the disclosure is not limited to thereto. More importantly, the doped region 440 is heavily doped by n-type dopants. Examples of n-type dopants that may be included in n-type doped regions include P, N, As, Sb, and Bi, but the disclosure is not limited to thereto. A concentration of the n-type dopants can be between about 1E18 ions/cm³ and about 1E22 ions/cm³, and a depth of ion implantation is between about 50 angstroms (Å), and about 500 Å, but the disclosure is not limited to thereto. In some embodiments, the doped region 440 includes a width W1, and the width W1 of the doped region 440 is greater than the width Wr of the recess 422, and also greater than the spacing distance S between the two gate structures 410.

Figure 5D:
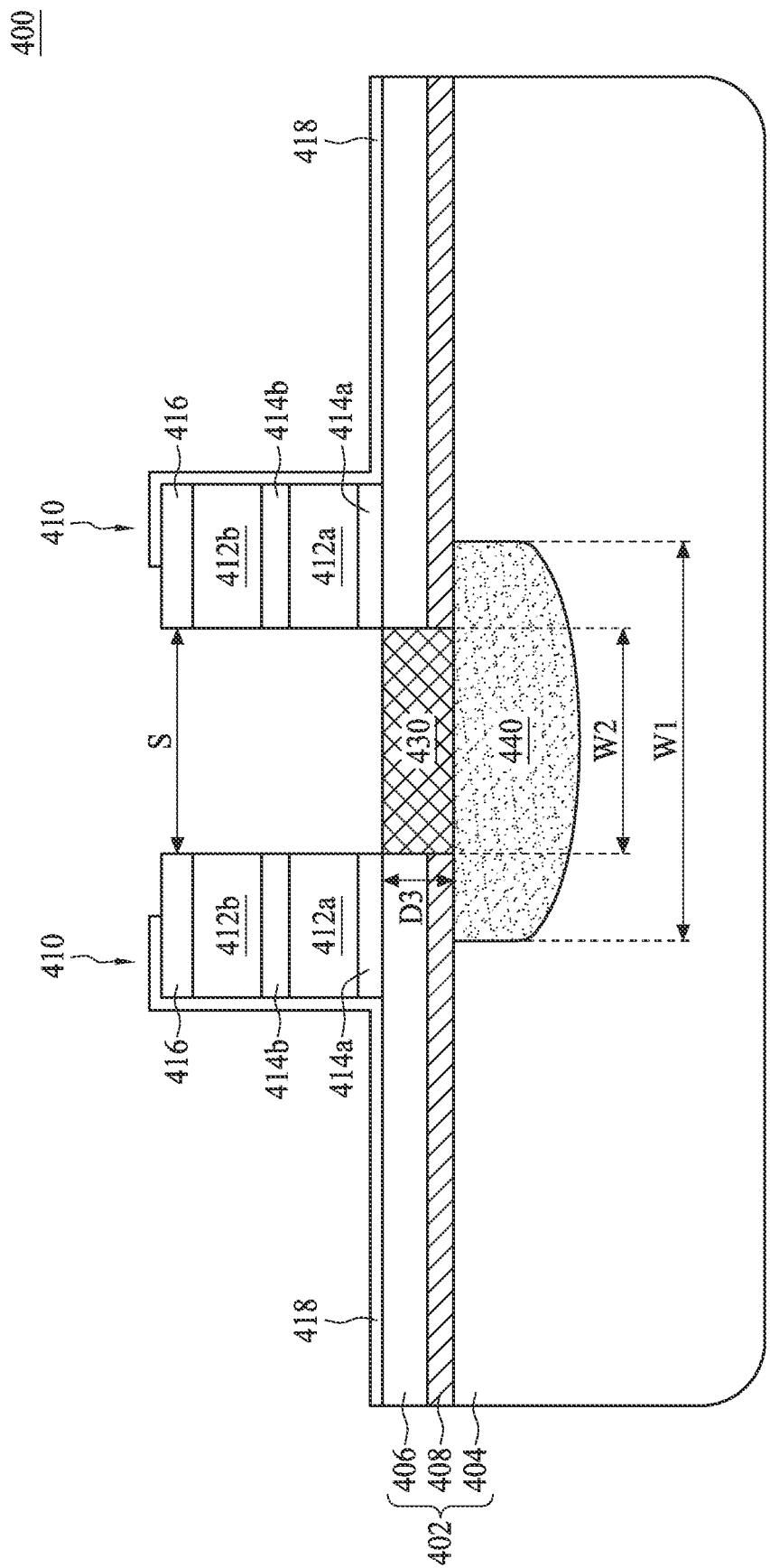

Referring to FIG. 5D, an epitaxial layer 430 is subsequently formed to fill the recess 422, according to operation 310. The epitaxial layer 430 can be formed by SEG, but the disclosure is not limited to thereto. More importantly, the epitaxial layer 430 is heavily doped by n-type dopants. Examples of n-type dopants that may be included in n-type doped regions include P, N, As, Sb, and Bi, but the disclosure is not limited to thereto. A concentration of the n-type dopants can be between about 1E18 ions/cm³ and about 1E22 ions/cm³, but the disclosure is not limited to thereto. In some embodiments, the concentration of the n-type dopants in the epitaxial layer 430 is different from the concentration of the n-type dopants in the doped region 440. In some embodiments, the concentration of the n-type dopants in the epitaxial layer 430 is substantially the same as the concentration of the n-type dopants in the doped region 440. Because the epitaxial layer 430 grows along the semiconductor surface exposed from the recess 422, the epitaxial layer 430 is confined between the two gate structures 410. A width W2 of the epitaxial layer 430 is substantially equal to the width Wr of the recess 422. In other words, the width W2 of the epitaxial layer 430 is substantially equal to or less than the spacing distance S between the two gate structures 410. Accordingly, a heavily-doped epitaxial layer 430 that is able to reduce Rs is obtained while the cell shrinkage capability is improved because junction depth and width are not issues. Further, the doped region 440, which includes area larger than the epitaxial layer 430, can further improve Rs reduction. More importantly, since the doped region 440 is formed under the epitaxial layer 430 and under the insulating layer 408, the large junction depth and width of the doped region 440 scarcely render impact to channels of the memory cell devices to be formed. Accordingly, cell shrinkage capability is improved because junction depth and width still are not issues. In some embodiments, the doped region 440 and the epitaxial layer 430 together serve as a source structure, or a source line (SL).

Figure 5E:
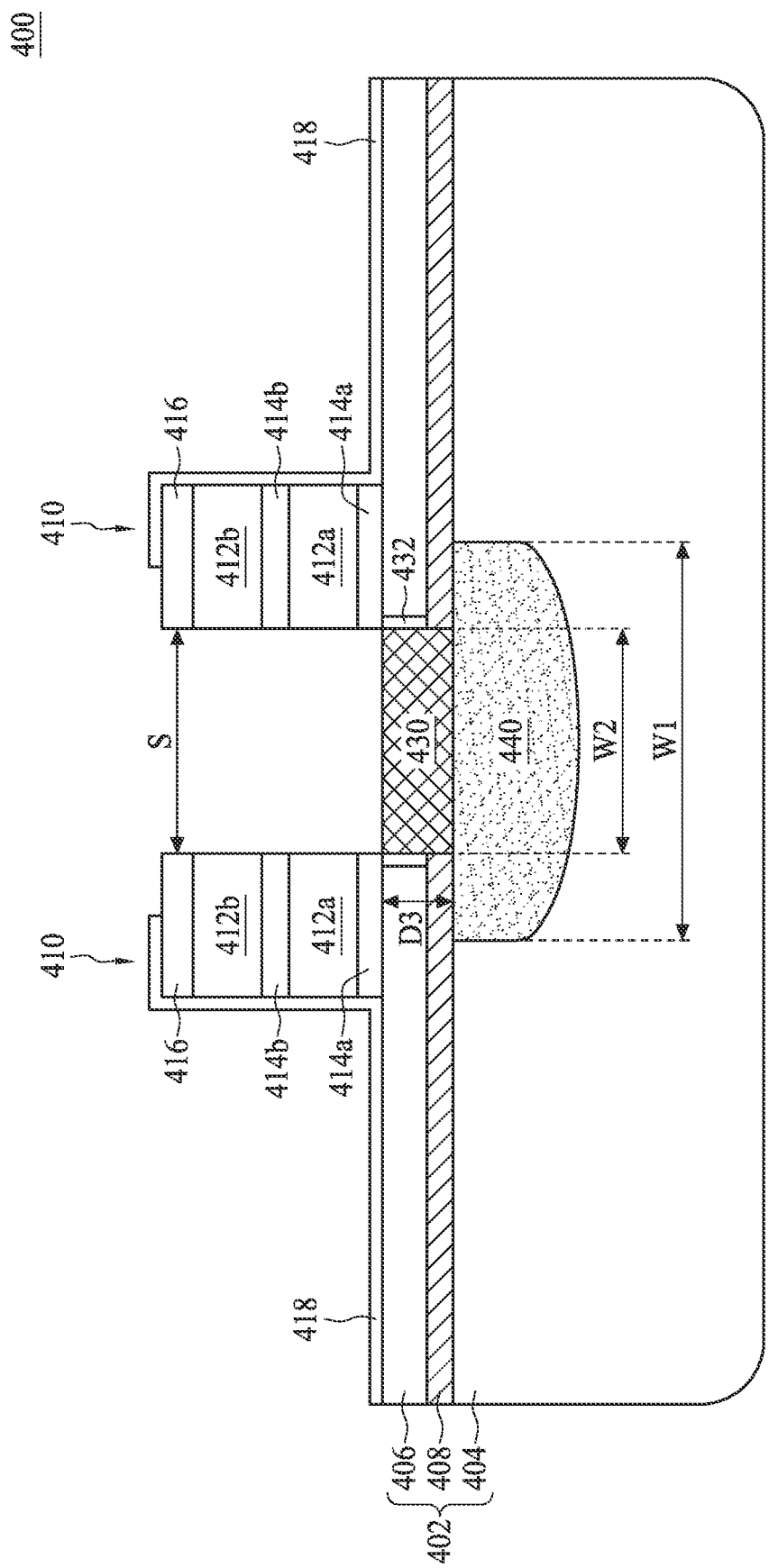

Referring to FIG. 5E, in some embodiments, a lightly-doped region 432 can be formed before forming the epitaxial layer 430. The lightly-doped region 432 is also doped by n-type dopants, and is formed by angle implantation, but the disclosure is not limited to thereto.

Figure 5F:
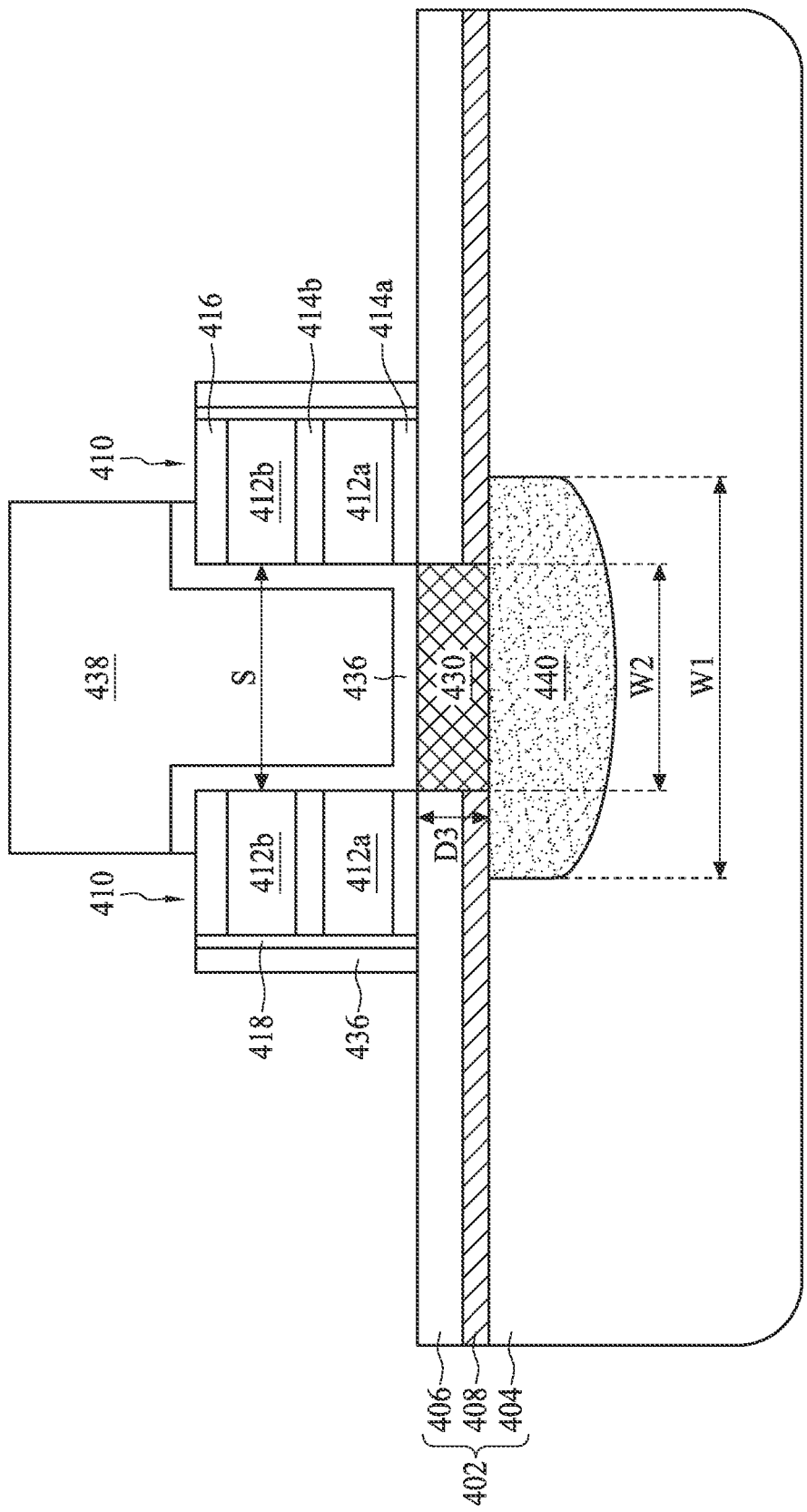

Referring to FIG. 5F, spacers are then formed on sidewalls of the gate structures 410. The spacers can be formed by conformally forming a dielectric layer 436 over top surfaces of the substrate 402, the epitaxial layer 430 and the hard mask layer 416, and over sidewalls of first dielectric layer 414a, the FG electrode 412a, the second dielectric layer 414b, the CG electrode 412b, and the hard mask layer 416. The dielectric layer 436 is then etched through a patterned photoresist 438, and thus the spacers are obtained as shown in FIG. 5F. In some embodiments of the present disclosure, the spacers 436 respectively include a multi-layered structure formed by multiple operation process. For example but not limited to, the spacers can be an ONO composite film. More importantly, the dielectric layer 436 covers a top surface of the epitaxial layer 430, as shown in FIG. 5F.

Figure 5G:
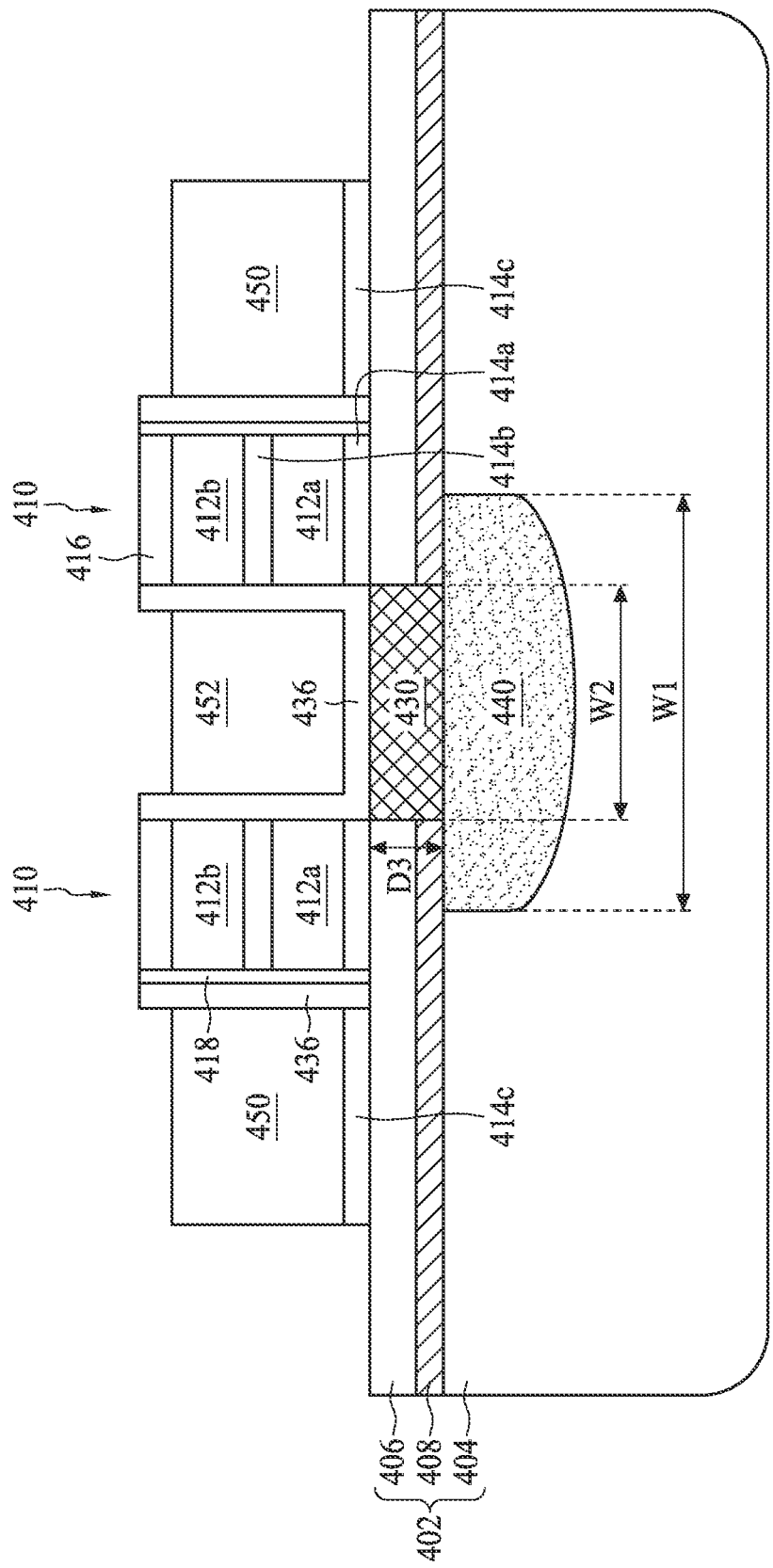

Referring to FIG. 5G, two third gate electrodes 450 are formed over the substrate 402, and a fourth gate electrode 452 is formed over the epitaxial layer 430. Furthermore, the third gate electrodes 450 are spaced apart and electrically isolated from the substrate 402 by a dielectric layer 414c while the fourth gate electrode 452 is spaced apart and electrically isolated from the epitaxial layer 430 by at least the dielectric layer 436. In some embodiments, the third gate electrodes 450 are select gate (SG) electrodes and the fourth gate electrode 452 is an erase gate (EG) electrode. In some embodiments, the SG electrodes 450 and the EG electrode 452 can include polysilicon. In other embodiments, the SG electrodes 450 and the EG electrode 452 can include doped silicon, metal such as Al, Cu, W, Ti, Ta, TiN, TaN, NiSi, CoSi, other suitable conductive materials, or combination thereof. The dielectric layer 414c interposed between the SG electrodes 450 and the substrate 402 serves as select gate dielectric, while the dielectric layer 436 interposed between the EG electrode 452 and the epitaxial layer 430 provides isolation between the EG electrode and the source line. In some embodiments, the dielectric layer 414c can include an oxide, such as a SiO, but the disclosure is not limited thereto.

Figure 5H:
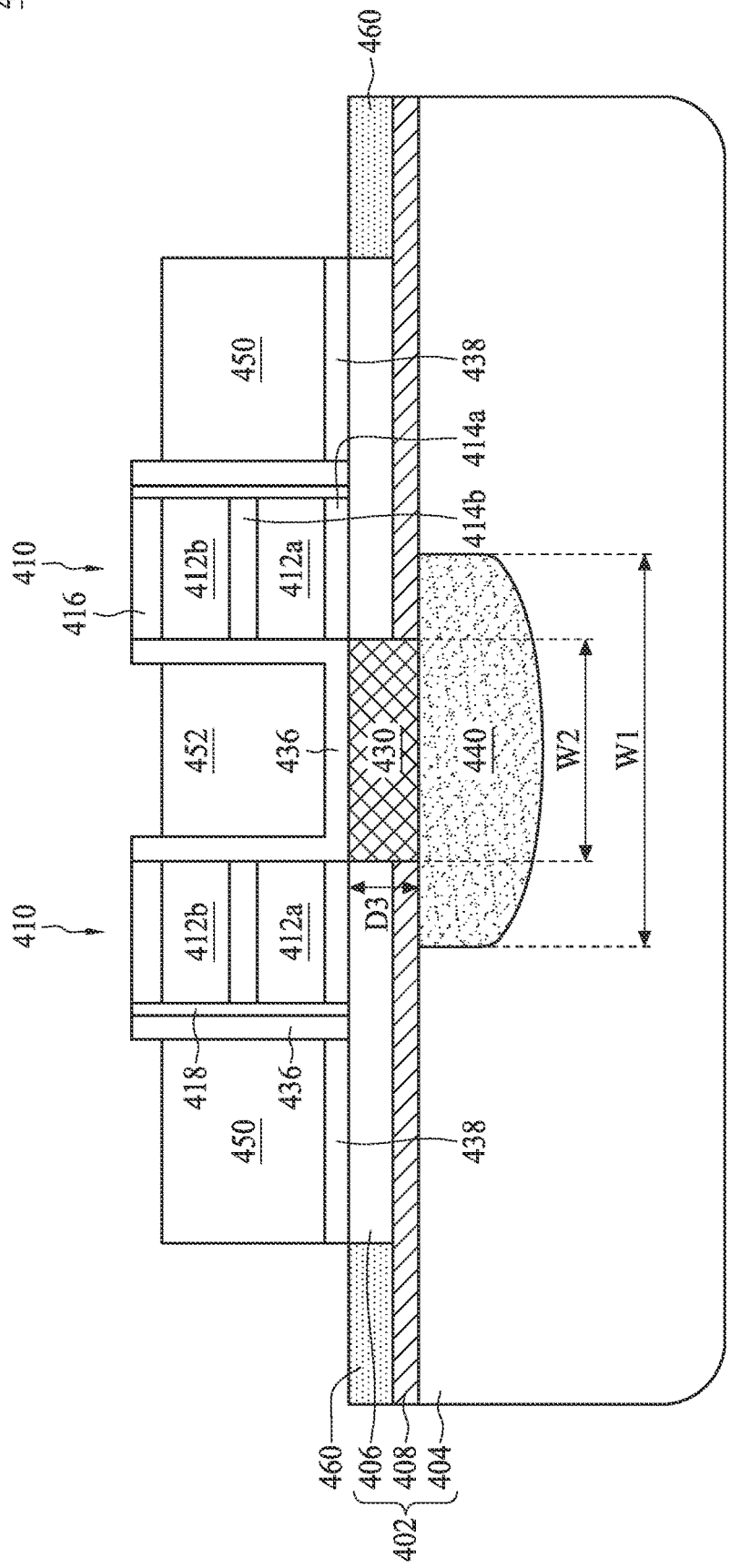

Referring to FIG. 5H, after forming the SG electrodes 450 and the EG electrode 452, another doped region 460 is formed, and the doped region 460 serves as a drain structure 460. In some embodiments, the drain structures 460 are electrically connected to bit lines (BLs). The doped region 460 can be formed by performing ion implantation to the second semiconductor layer 406. Accordingly, the drain structures 460 are doped second semiconductor material. In some embodiments, the ion implantation concentration for forming the doped region 460 can be the same as that for forming the doped region 440 and/or the epitaxial layer 430. In some embodiments, the ion implantation concentration for forming the doped region 460 can be different from that for forming the doped region 440 and/or the epitaxial layer 430.

Figure 5I:
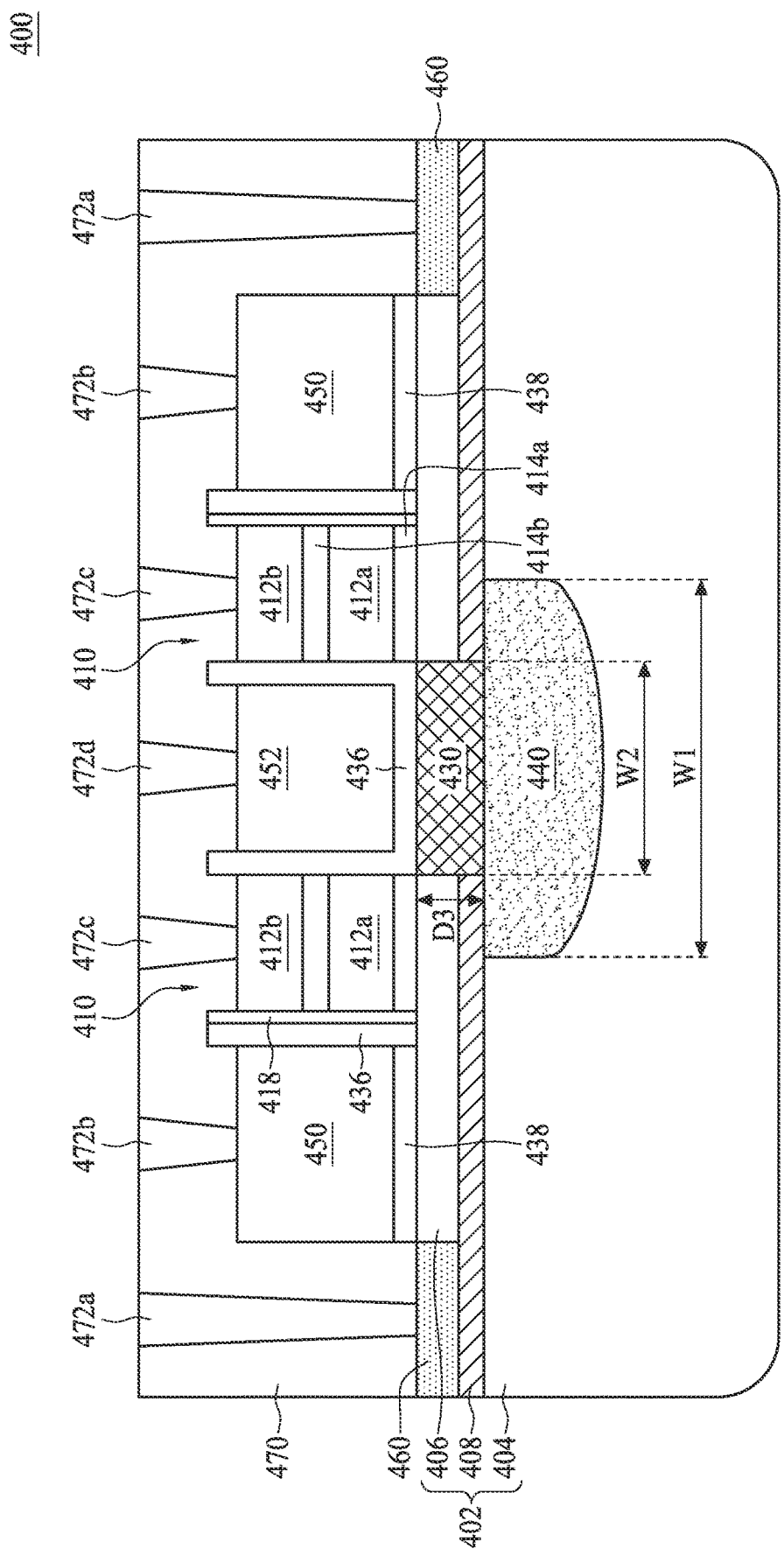
Figure 5J:
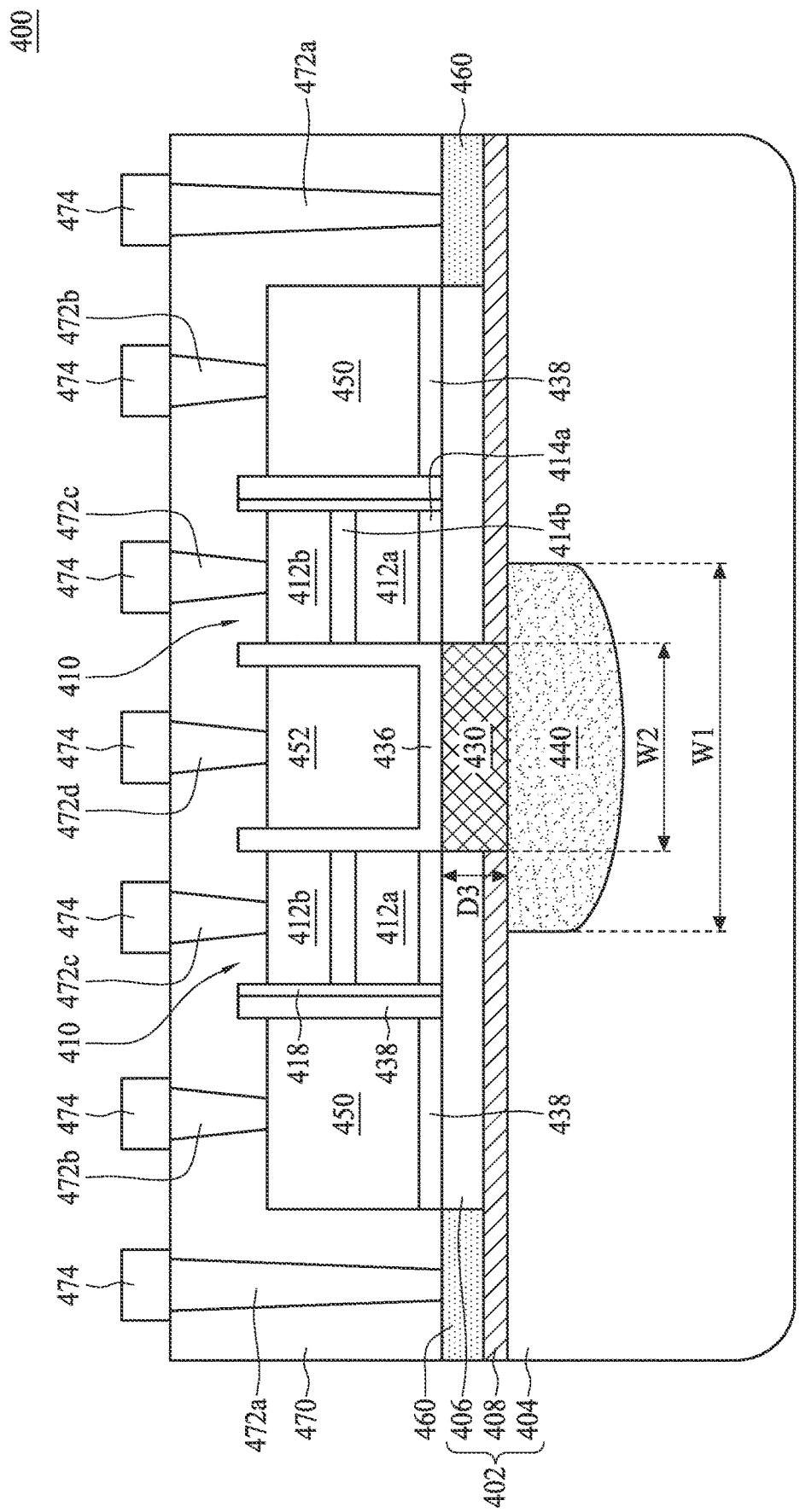

Referring to FIG. 5I, the hard mask layer 416 is removed, and followed by disposing a dielectric layer 470 serving as an inter-layer dielectric (ILD) layer 470. The ILD layer 470 can include SiO, SiN, SiON, TEOS-formed oxide, phosphosilicate glass (PSG), borophosphosilicate (BPSG), low-k dielectric material, other suitable dielectric materials, and/or combination thereof. Exemplary low-k dielectric materials include fluorinated silica glass (FSG), carbon doped silicon oxide, Black Diamond® (Applied Materials of Santa Clara, Calif.), xerogel, aerogel, amorphous fluorinated carbon, parylene, BCB (bis-benzocyclobutenes), SiLK® (Dow Chemical, Midland, Mich.), polyimide, other proper materials, and/or combinations thereof. Additionally, the ILD layer 470 may alternatively be a multilayer structure having multiple dielectric materials. In some embodiments, a plurality conductive structures 472a to 472d is formed in the ILD layer 470. As shown in FIG. 5I, a conductive structure 472a is formed to electrically connect the drain structure 460, respectively. A conductive structure 472b is formed to electrically connect the SG electrode 450, respectively. A conductive structure 472c is formed to electrically connect the CG electrode 412b, respectively. And a conductive structure 472d is formed to electrically connect the EG electrode 452. Referring to FIG. 5J, in some embodiments, conductive lines 474 are subsequently formed over the ILD layer 470 to connect the conductive structures 472a to 472d. Consequently, a memory device 400 is obtained as shown in FIG. 5J.

Still referring to FIG. 5J, accordingly the memory device 400 includes the substrate 402, at least the gate structure 410 disposed over the substrate 402, the drain structure 460 disposed in the substrate 402 at one side of the gate structure 410, and the source structure 430/440 disposed over the substrate 402 on an opposite side of the gate structure 410 from the drain structure 460. The substrate 402 includes the first semiconductor layer 404, the second semiconductor layer 406 over the first semiconductor layer 402, and the insulating layer 408 sandwiched between the first semiconductor layer 404 and the second semiconductor layer 406. The drain structure 460 and the source structure 430/440 all include a conductivity type, such as the n type. However, the drain structure 460 is different from the source structure 430/440. In some embodiment, the source structure 430/440 extends deeper into the substrate 402 than the drain structure 460. For example, the drain structure 460 extends into the substrate 402 above a top boundary of the insulating layer 408, and the source structure 430/440 extends into the substrate 402 under the top boundary of the insulating layer 408. As shown in FIG. 5J, the source structure includes the epitaxial layer 430 and the doped region 440 under the epitaxial layer 430 while the drain structure 460 includes only the doped region. In some embodiments, the doped region 440 is taken as a lower portion 440 of the source structure and the epitaxial layer 430 over the doped region 440 is taken as an upper portion 430 of the source structure. The lower portion 440 is arranged under a bottom boundary of the insulating layer 408 and the upper portion 430 disposed over the lower portion 440 and the over the bottom boundary of the insulating layer 408. In some embodiments, at least a portion of a top boundary of the lower portion (the doped region) 440 is in contact with a bottom boundary of the insulating layer 408, and the sidewalls and the bottom of the lower portion 440 are all in contact with the first semiconductor layer 404, as shown in FIG. 5J. The sidewalls of the upper portion (the epitaxial layer) 430 are in contact with both of the insulating layer 408 and the second semiconductor layer 406. Different from the source structure 430/440, the doped region/drain structure 460 includes a bottom surface, and the bottom boundary of the doped region/drain structure 460 is in contact with a top boundary of the insulating layer 408. Further, implantation concentrations for forming the lower portion 440 and the upper portion 430 of the source structure can be different or the same as the drain structure 460.

On the hand, the memory device 400 provides two gate structures 410 disposed over the substrate 402, and the two gate structures 410 are spaced apart from each other. The memory device 400 further provides the source structure 430/440 including the upper portion 430 and the lower portion 440 disposed in the substrate 402 and between the two gate structures 410. Also as shown in FIG. 5J, the width W1 of the lower portion 440 of the source structure is greater than the width W2 of the upper portion 430 of the source structure, and the width W2 of the upper portion 430 is equal to or less than the spacing distance between the two gate structures 410. In other words, the width W1 of the lower portion 440 is greater than the spacing distance between the two gate structures 410. As mentioned above, each of the gate structures 410 includes the first gate electrode (FG) 412a, the second gate electrode (CG) 412b, and the dielectric layer (IPO) 414b sandwiched between the first gate electrode 412a and the second gate electrode 412b. The memory device 400 further includes the select gates 450 and the erase gate 452, and the bit line 460, and those details are omitted for brevity.

Figure 6:
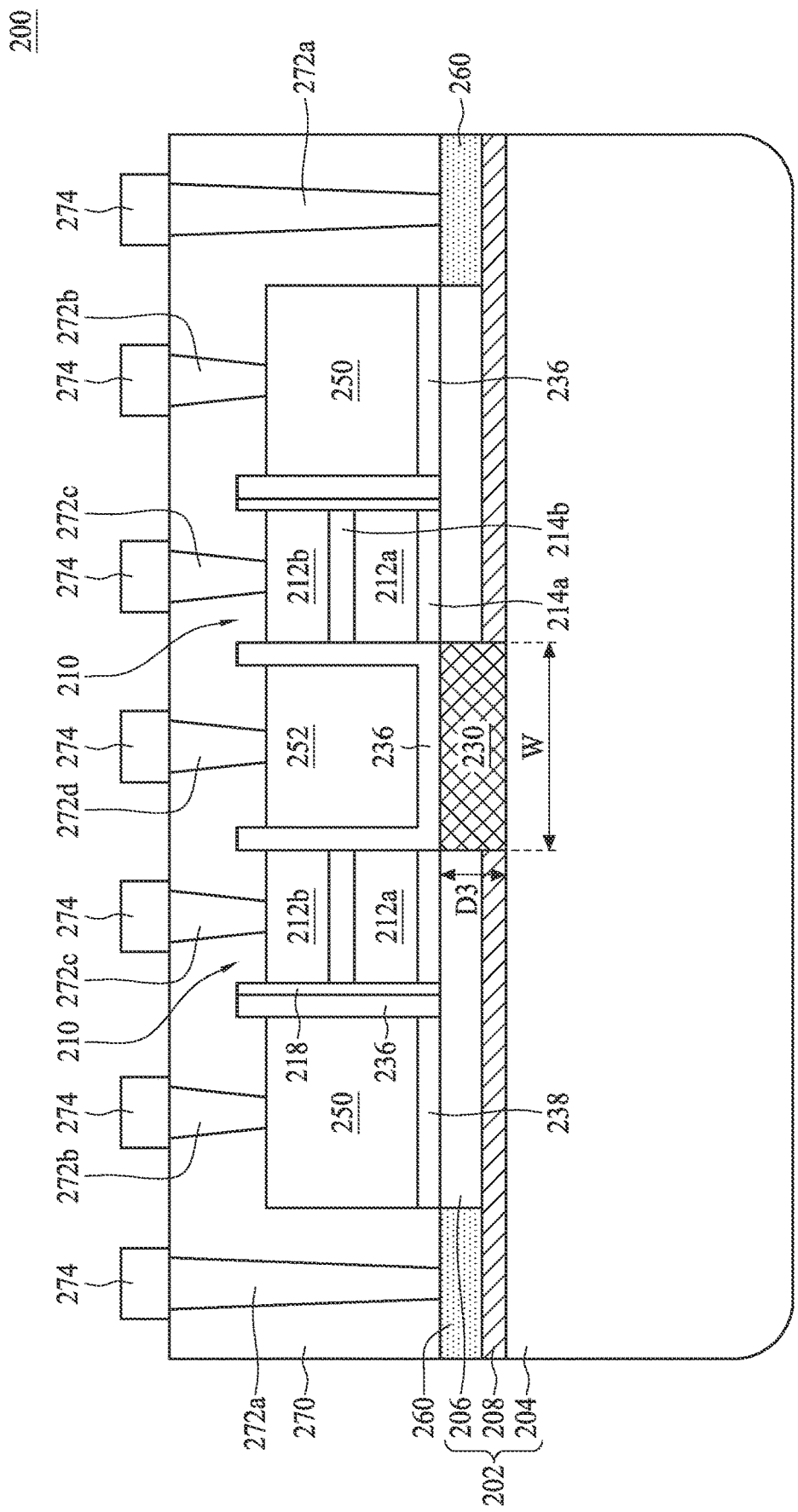
FIG. 6 illustrates a semiconductor structure for a memory device according to aspects of the present disclosure in one or more embodiments.

Referring to FIG. 6, in some embodiments, operations depicted as shown FIGS. 5F-5J can be performed to devices subsequently to operations as shown in FIG. 2C or FIG. 2D. Accordingly, memory device 200 is obtained as shown in FIG. 6, and those details are omitted in the interest of brevity. The memory device 200 includes the substrate 202, at least the gate structure 210 disposed over the substrate, the drain structure 260 disposed in the substrate 202 at one side of the gate structure 210, and the source structure 230 disposed over the substrate 202 on an opposite side of the gate structure 210 from the drain structure 260. The substrate 202 includes the first semiconductor layer 204, the second semiconductor layer 206 over the first semiconductor layer 202, and the insulating layer 208 sandwiched between the first semiconductor layer 204 and the second semiconductor layer 206. The drain structure 260 and the source structure 230 include a conductivity type, such as the n type. It should be noted that the source structure 230 and the drain structure 260 are different from each other. As shown in FIG. 6, the source structure 230 includes the epitaxial layer 230 while the drain structure 260 includes the doped region. As mentioned above, the drain structure 260 is formed by doping or implanting the second semiconductor layer 206. In other words, the drain structure 260 is a doped region of the second semiconductor layer 206. In some embodiments, the drain structure 260 is a doped polysilicon or doped single crystalline silicon. The source structure 230, as mentioned above, includes the doped epitaxial layer. It is found that the source structure 230 and the drain structure include at least different crystal structures. Additionally, implantation concentrations for forming the source structure 230 and the drain structure 260 can be different or the same, depending on different requirements.

On the hand, the memory device 200 provides two gate structures 210 disposed over the substrate 202, and the two gate structures 210 are spaced apart from each other. The memory device 200 further provides the source structure (the epitaxial layer) 230 disposed in the substrate 202 and between the two gate structures 210. As shown in FIG. 6, the sidewalls of the source structure 230 are in contact with the insulating layer 208 and the second semiconductor layer 206. In some embodiments, a bottom boundary of the insulating layer 208 and a bottom boundary of the source structure 230 substantially are in a same level. Also as shown in FIG. 6, the bottom boundary of the source structure 230 therefore may be contact with a top boundary of the first semiconductor layer 204. As mentioned above, a width W of the source structure 230 is equal to or less than the spacing distance between the two gate structures 210. As mentioned above, each of the gate structures 210 includes the first gate electrode (FG) 212a, the second gate electrode (CG) 212b, and the dielectric layer (IPO) 214b sandwiched between the first gate electrode 212a and the second gate electrode 212b. The memory device 200 further includes the select gates 250 and the erase gate 252, and the bit line 260, and those details are omitted for brevity. Additionally, the memory device 200 can be embedded in the ILD layer 270 and electrically connected to other device by conductive structures 272a-272d and conductive lines 274, and those details are omitted for brevity.

Figure 7:
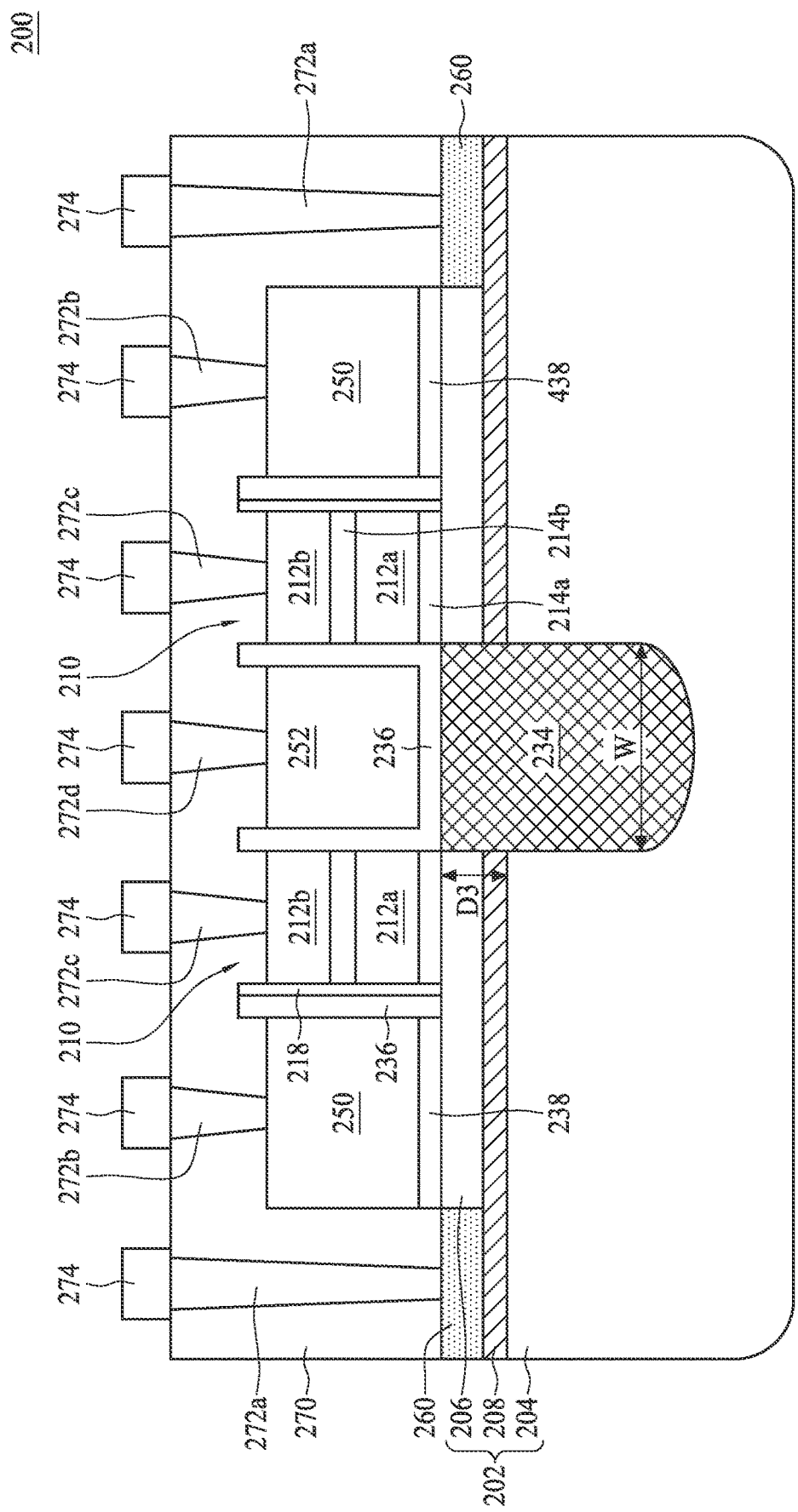
FIG. 7 illustrates a semiconductor structure for a memory device according to aspects of the present disclosure in one or more embodiments.

Referring to FIG. 7, in some embodiments, operations depicted as shown FIGS. 5F-5J can be performed to devices subsequently to operations as shown in FIG. 3B or 3C. Accordingly memory device 200 is obtained as shown in FIG. 7, and those details are omitted in the interest of brevity. In some embodiments, a bottom boundary of the source structure (the epitaxial layer) 234 is lower than a bottom boundary of the insulating layer 208. Further, the sidewalls of the source structure 234 are in contact with the first semiconductor layer 204, the insulating layer 208 and the second semiconductor layer 206 while a bottom boundary of the source structure 234 is only contact with the first semiconductor layer 204. The drain structure 260 is different from the source structure 234. In some embodiments, the drain structure 260 is a doped polysilicon or doped single silicon. The source structure 234, as mentioned above, includes the doped epitaxial layer. Further, implantation concentrations for forming the source structure 234 and the drain structure 260 can be different or the same, depending on different requirements. Accordingly, the source structure 234 and the drain structure 260 can include different crystal structures. In some embodiments, the source structure 234 and the drain structure 260 can include different depths, as shown in FIG. 7.

It will be appreciated that in the forgoing method, the source structure including the epitaxial layer or including both the epitaxial layer and the doped region are formed in the substrate. A width of the epitaxial layer is substantially equal to or less than the spacing distance between the two gate structures. That is, the width of the epitaxial layer is substantially a width of a source line to be formed. Different from the epitaxial layer, a width of the doped region is greater than the spacing distance between the two gate structures. As mentioned above, the epitaxial layer is confined between the two gate structures 410. Accordingly, a heavily-doped epitaxial layer that is able to reduce Rs is obtained while the cell shrinkage capability is improved because there is no junction depth and width issues for the epitaxial layer. Further, the doped region, which includes area larger than the epitaxial layer can further improve Rs reduction. As mentioned above, since the doped region is confined under the epitaxial layer and under the insulating layer, the large junction depth and width of the doped region scarcely render impact to operations of the memory cell device to be formed, and thus cell shrinkage capability is improved because junction depth and width still are not issues.

According to one embodiment of the present disclosure, a method for manufacturing a memory device is received. The method includes following operations. A substrate including a first semiconductor layer, a second semiconductor layer over the first semiconductor layer, and an insulating layer sandwiched between the first semiconductor layer and the second semiconductor layer is received. Two gate structures are disposed over the substrate, and the two gate structures are spaced apart from each other. A recess is formed in the substrate between the two gate structures. An epitaxial layer is formed to fill the recess.

According to one embodiment of the present disclosure, a method for manufacturing a memory device is received. A substrate is received. The substrate includes a first semiconductor layer, a second semiconductor layer over the first semiconductor layer, and an insulating layer sandwiched between the first semiconductor layer and the second semiconductor layer. Two first gate structures are disposed over the substrate. The two first gate structures are spaced apart from each other. A recess is formed in the substrate between the two first gate structures. The first semiconductor layer is exposed through a bottom of the recess. The first semiconductor layer, the insulating layer and the second semiconductor layer are exposed through sidewalls of the recess. An epitaxial source region si formed to fill the recess.

According to one embodiment of the present disclosure, a method for manufacturing a memory device is received. A substrate is received. The substrate includes a first semiconductor layer, a second semiconductor layer over the first semiconductor layer, and an insulating layer sandwiched between the first semiconductor layer and the second semiconductor layer. Two first gate structures are disposed over the substrate. The two first gate structures are spaced apart from each other. A recess is formed in the substrate between the two first gate structures. The first semiconductor layer is exposed through a bottom of the recess. A doped region is formed in the first semiconductor layer exposed through the recess. An epitaxial source region is formed to fill the recess.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a memory device, comprising:
   receiving a substrate comprising a first semiconductor layer, a second semiconductor layer over the first semiconductor layer, and an insulating layer sandwiched between the first semiconductor layer and the second semiconductor layer;
   disposing two first gate structures over the substrate, the two first gate structures being spaced apart from each other;
   forming a recess in the substrate between the two first gate structures; and
   forming an epitaxial layer to fill the recess,
   wherein a portion of a top surface of the first semiconductor layer is exposed from a bottom of the recess before forming the epitaxial layer.

2. The method of claim 1, further comprising forming a doped region in the first semiconductor layer exposed from the recess before forming the epitaxial layer.

3. The method of claim 1, wherein a top surface of the epitaxial layer is higher than a top surface of the insulating layer.

4. The method of claim 1, further comprising:
   forming two drain regions in the second semiconductor layer;
   forming a second gate structure over the epitaxial layer; and
   forming two third gate structures adjacent to the two first gate structures,
   wherein the second gate structure is between the two first gate structures, and the two first gate structures are between the two third gate structures.

5. The method of claim 4, wherein the drain regions are in contact with a top surface of the insulating layer.

6. A method for manufacturing a memory device, comprising:
   receiving a substrate comprising a first semiconductor layer, a second semiconductor layer over the first semiconductor layer, and an insulating layer sandwiched between the first semiconductor layer and the second semiconductor layer;
   disposing two first gate structures over the substrate, the two first gate structures being spaced apart from each other;
   forming a recess in the substrate between the two first gate structures, wherein the first semiconductor layer is exposed through a bottom of the recess, and the first semiconductor layer, the insulating layer and the second semiconductor layer are exposed through sidewalls of the recess; and
   forming an epitaxial source region to fill the recess.

7. The method of claim 6, further comprising forming a lightly-doped region in the first semiconductor layer and the second semiconductor layer through the sidewalls of the recess before the forming of the epitaxial source region.

8. The method of claim 6, wherein the epitaxial source region comprises a doped epitaxial layer.

9. The method of claim 8, further comprising forming an undoped epitaxial layer before the forming of the doped epitaxial layer.

10. The method of claim 9, wherein the doped epitaxial layer comprises a first germanium (Ge) concentration, the undoped epitaxial layer comprises a second Ge concentration, and the second Ge concentration is lower than the first Ge concentration.

11. The method of claim 6, wherein a top surface of the epitaxial source region is higher than a top surface of the insulating layer.

12. The method of claim 6, further comprising:
   forming two drain regions in the second semiconductor layer;
   forming a second gate structure over the epitaxial source region; and
   forming two third gate structures adjacent to the two first gate structures,
   wherein the second gate structure is between the two first gate structures, and the two first gate structures are between the two third gate structures.

13. The method of claim 12, wherein the drain regions are in contact with a top surface of the insulating layer.

14. A method for manufacturing a memory device, comprising:
   receiving a substrate comprising a first semiconductor layer, a second semiconductor layer over the first semiconductor layer, and an insulating layer sandwiched between the first semiconductor layer and the second semiconductor layer;
   disposing two first gate structures over the substrate, the two first gate structures being spaced apart from each other;
   forming a recess in the substrate between the two first gate structures, wherein the first semiconductor layer is exposed through a bottom of the recess;
   forming a doped region in the first semiconductor layer exposed from the recess; and
   forming an epitaxial source region to fill the recess.

15. The method of claim 14, wherein a portion of a top surface of the first semiconductor layer is exposed from the bottom of the recess before forming the epitaxial source region.

16. The method of claim 14, further comprising forming a lightly-doped region in the first semiconductor layer before the forming of the epitaxial source region.

17. The method of claim 14, wherein a width of the doped region is greater than a width of the epitaxial source region.

18. The method of claim 14, wherein a top surface of the epitaxial source region is higher than a top surface of the insulating layer.

19. The method of claim 1, wherein the epitaxial layer comprises a doped epitaxial layer.

20. The method of claim 1, further comprising forming a lightly-doped region before the forming of the epitaxial layer.

* * * * *